US008697546B2

(12) United States Patent
Ono

(10) Patent No.: US 8,697,546 B2
(45) Date of Patent: Apr. 15, 2014

(54) METHOD OF MANUFACTURING SEMICONDUCTOR DEVICE

(76) Inventor: Kenta Ono, Tokyo (JP)

(*) Notice: Subject to any disclaimer, the term of this patent is extended or adjusted under 35 U.S.C. 154(b) by 0 days.

(21) Appl. No.: 13/461,616

(22) Filed: May 1, 2012

(65) Prior Publication Data

US 2012/0295415 A1 Nov. 22, 2012

(30) Foreign Application Priority Data

May 16, 2011 (JP) ................................. 2011-109438
Feb. 27, 2012 (JP) ................................. 2012-039946

(51) Int. Cl.
*H01L 21/30* (2006.01)

(52) U.S. Cl.
USPC .......................................... 438/459; 438/455

(58) Field of Classification Search
USPC ................................................. 438/455–459
See application file for complete search history.

(56) References Cited

U.S. PATENT DOCUMENTS

| 6,114,097 A * | 9/2000 | Malba et al. ................. 430/314 |
| 2005/0064709 A1 * | 3/2005 | Shimomura et al. .......... 438/689 |
| 2006/0234168 A1 * | 10/2006 | Kim et al. ..................... 430/330 |
| 2007/0178402 A1 * | 8/2007 | Lee et al. ...................... 430/199 |
| 2010/0009256 A1 | 1/2010 | Kusachi et al. |
| 2010/0255682 A1 * | 10/2010 | Trickett et al. ............... 438/692 |
| 2011/0136344 A1 * | 6/2011 | Reiss et al. ................... 438/693 |
| 2011/0241214 A1 * | 10/2011 | Feng et al. .................... 257/773 |
| 2012/0045611 A1 * | 2/2012 | Shih et al. .................... 428/137 |
| 2012/0276733 A1 * | 11/2012 | Saeki et al. ................... 438/613 |
| 2012/0329369 A1 * | 12/2012 | Shimizu et al. ................ 451/28 |

FOREIGN PATENT DOCUMENTS

| JP | 2011-023393 A | 2/2011 |
| WO | WO 2008/090832 A1 | 7/2008 |

* cited by examiner

*Primary Examiner* — Charles Garber
*Assistant Examiner* — Brigitte Patterson
(74) *Attorney, Agent, or Firm* — McGinn IP Law Group, PLLC

(57) ABSTRACT

A method of manufacturing a semiconductor device, comprising bonding a first principal surface of a substrate to a supporting substrate through a light-to-heat conversion film, and removing a portion of the light-to-heat conversion film exposed on the supporting substrate. A method of manufacturing a semiconductor device, comprising forming a light-to-heat conversion film on a supporting substrate, bonding a semiconductor substrate to the supporting substrate, so that the light-to-heat conversion film extends outside the semiconductor substrate, performing an anti-contamination treatment on the light-to-heat conversion film, and separating the supporting substrate and the semiconductor substrate from each other.

16 Claims, 20 Drawing Sheets

METHOD OF MANUFACTURING SEMICONDUCTOR DEVICE

This application is based upon and claims the benefit of priority from Japanese Patent Application No. 2011-109438 filed on May 16, 2011, and Japanese Patent Application No. 2012-39946 filed on Feb. 27, 2012, the disclosure of which are incorporated herein in its entirety by reference.

BACKGROUND OF THE INVENTION

1. Field of the Invention

The present invention relates to a method of manufacturing a semiconductor device.

2. Description of the Related Art

Japanese Patent Laid-Open No. 2011-23393 discloses a process of performing rear surface grinding on a substrate bonded to a wafer support system (hereinafter may be referred to as "WSS") through a light-to-heat conversion film (hereinafter may be referred to as "LTHC film"). Supporting a substrate by a WSS in this way enables the handling of the substrate after it is thinned to a thickness on the order of several tens of μm.

The inventor has investigated the technology of Japanese Patent Laid-Open No. 2011-23393, and the following problem has been found.

If the substrate is bonded to WSS, an outer circumference of the substrate is a little ground, thereby reducing the diameter of the substrate so that it is smaller than the diameter of WSS. For example, if the diameter of the substrate is 300 mm, the substrate is ground to the diameter of 298.5 mm. As a result, it is possible to prevent the substrate from being misaligned with the WSS when bonded thereto, or an adhesive agent from running off out of the WSS. Moreover, it is possible to reduce the degree of the outer circumference of semiconductor substrate 2 after grinding becoming knife-edged.

However, as described above, when the diameter of the substrate is smaller than the diameter of WSS, as illustrated in FIGS. 21 and 22 of Japanese Patent Laid-Open No. 2011-23393, the LTHC film is exposed on the surface of WSS at the substrate side. The LTHC film may contain an organic substance or metal. In this case, the subsequent process proceeds while the LTHC film is exposed in region close to the substrate, it was found that LTHC film-derived contaminants occur on the surface of the substrate.

In particular, the inventor has investigated a method of manufacturing a semiconductor device which comprises through silicon via (hereinafter, through silicon via may be referred as "TSV"). In this method, the protective film needs to be formed on the ground surface of the substrate after grinding the substrate. Therefore, when the protective film is formed with the wafer surface of the substrate contaminated, contaminants are hard to be removed by subsequent cleaning.

In this way, it was found that in the method of manufacturing a semiconductor device including the step of grinding the substrate bonded to WSS through LTHC film, the method has room for improvement in terms of reducing the contaminants.

SUMMARY

In one embodiment, there is provided a method of manufacturing a semiconductor device, comprising:
bonding a first principal surface of a substrate to a supporting substrate through a light-to-heat conversion film; and
selectively removing a portion of the light-to-heat conversion film exposed on the supporting substrate.

In another embodiment, there is provided a method of manufacturing a semiconductor device, comprising:
forming a light-to-heat conversion film on a supporting substrate;
bonding a semiconductor substrate to the supporting substrate, so that the light-to-heat conversion film extends outside the semiconductor substrate;
performing an anti-contamination treatment on the light-to-heat conversion film; and
separating the supporting substrate and the semiconductor substrate from each other.

BRIEF DESCRIPTION OF THE DRAWINGS

The above features and advantages of the present invention will be more apparent from the following description of certain preferred embodiments taken in conjunction with the accompanying drawings, in which.

Figure 1:
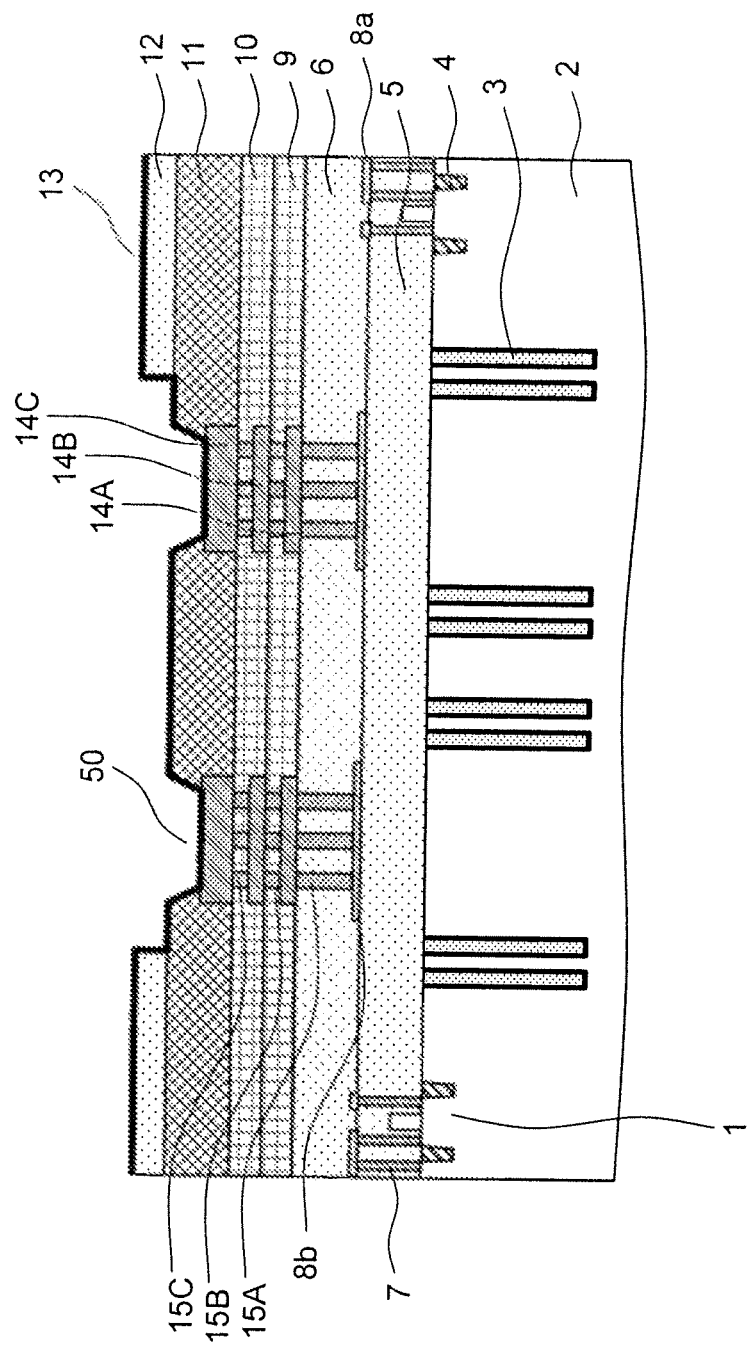
FIGS. 1 to 13 are schematic views illustrating a semiconductor device manufacturing method according to a first exemplary embodiment.

In the drawings, numerals have the following meanings. 1: element, 2: semiconductor substrate, 3: insulating ring, 4: isolation region, 5: first interlayer insulating film, 6: second interlayer insulating film, 7: contact plug, 8a, 8b: local wiring, 9: third interlayer insulating film, 10: fourth interlayer insulating film, 11: surface protection film, 12: polyimide film, 13: seed layer, 14A: first wiring, 14B: second wiring, 14C: third wiring, 15A: local contact plug, 15B: first contact plug, 15C: second contact plug, 16: copper bump, 17: Ni film, 18: Au film, 20: chip-forming region, 21: photoresist, 22: adhesive agent, 23: LTHC film, 24: WSS, 25: cover film, 26: protective film, 27: third opening, 28: seed layer, 29: copper bump, 30: photoresist pattern, 31: solder film (SnAg film), 32a, 32b: semiconductor chip, 33: dicing tape, 35: underfill, 37: molding resin, 39: package substrate, 40: silicon oxide film, 41: silicon nitride film, 42: masking blade, 50: first opening, 51: second opening, X: element region, and Y: through silicon via region.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

(First Embodiment)

A method of manufacturing a semiconductor device with a through silicon via according to the present exemplary embodiment will be described with reference to FIGS. 1 to 13.

As illustrated in FIG. 1, a semiconductor substrate (wafer) 2 made of silicon (Si) is prepared. Semiconductor substrate 2 includes a first principal surface (front surface) in which element 1, such as an MIS transistor, and an interlayer insulating film are provided, as will be described later. In addition, semiconductor substrate 2 includes a second principal surface (rear surface) facing the first principal surface in the thickness direction of the substrate 2. That is, semiconductor substrate 2 includes the second principal surface facing the first principal surface and positioned on the opposite side thereof. As will be described later, a through silicon via is provided so as to penetrate through semiconductor substrate 2 from the second principal surface side thereof.

A ring-shaped opening is formed in semiconductor substrate 2 by dry etching using a photolithographic technique. The depth of the ring-shaped opening is set according to the thickness of semiconductor substrate 2 formed as the result of being polished finally. The width of the ring-shaped opening is set to, for example, 2 to 3 μm.

A silicon nitride film is formed by a CVD (Chemical Vapor Deposition) method, so as to cover the inner surface of the ring-shaped opening. After this, the ring-shaped opening is filled with a silicon oxide film by using a CVD method. Portions of the silicon nitride film and the silicon oxide film on the upper surface of semiconductor substrate 2 are removed by etching, thereby leaving over the silicon nitride film and the silicon oxide film only within the ring-shaped opening. Consequently, insulating ring 3 is formed. Insulating ring 3 is formed so as to surround a predetermined region of semiconductor substrate 2. As will be described later, parts of the through silicon via, such as a front surface bump, are formed above this predetermined region. That is, the predetermined region is positioned below part of the through silicon via.

Isolation region 4 for dividing off an active region is formed on a surface of semiconductor substrate 2 by using an STI method. Element 1, such as a transistor, is formed in the active region.

An SOD film (Spin On Dielectrics: a coating-based insulating film, such as polysilazane) is deposited by a spinner method. Thereafter, an annealing treatment is performed in a high-temperature steam ($H_2O$) atmosphere to reform a solid-state deposited film, thereby forming first interlayer insulating film 5. At this time, a liner film may be formed on the first principal surface of semiconductor substrate 2 by using a silicon nitride film or the like having oxidation resistance, before forming first interlayer insulating film 5. By forming the liner film, it is possible to prevent any already-formed underlying elements from being oxidized and thus damaged at the time of the annealing treatment of the SOD film. A silicon oxide film formed by a CVD method may be provided in place of the SOD film.

Next, contact plug 7 reaching to an impurity-diffused layer of element 1 is formed within first interlayer insulating film 5. After this, a laminated film in which tungsten nitride (WN) and tungsten (W) are deposited in order, is formed and then patterned, thereby forming local wiring 8a connected to contact plug 7. At the same time, local wiring 8b is formed in a through silicon via-forming region (insulating ring 3, a region within semiconductor substrate 2 surrounded by insulating ring 3, and regions above and below these regions).

Local wiring 8b may be in electrical conduction with another local wiring in an unillustrated part. Local wiring 8b functions as a pad for connection to a through silicon via plug to be formed in a later step. Next, second interlayer insulating film 6 is formed using an SOD film, so as to cover local wiring 8b. Second interlayer insulating film 6 may be formed by a CVD method.

After this, local contact plug 15A for connection to local wiring 8b is formed using a metal film, such as tungsten. Next, upper-layer first wiring 14A is formed using aluminum (Al) or copper (Cu), so as to connect to local contact plug 15A. Third interlayer insulating film 9 is formed using a silicon oxide film or the like, so as to cover first wiring 14A. First contact plug 15B for connection to first wiring 14A is formed within third interlayer insulating film 9 by using a metal film, such as tungsten.

Next, second wiring 14B is formed on third interlayer insulating film 9 by using aluminum (Al), copper (Cu) or the like, so as to connect to first contact plug 15B. Fourth interlayer insulating film 10 is formed using a silicon oxide film or the like, so as to cover second wiring 14B. Second contact plug 15C is formed using a metal film, such as tungsten, so as to penetrate through fourth interlayer insulating film 10 and connect to second wiring 14B.

Next, third wiring 14C is formed using aluminum or the like, so as to be connected to second contact plug 15C. Third wiring 14C is the uppermost wiring layer and serves also as a pad when a bump electrode is formed on a surface of the wiring layer. It is therefore preferable to avoid using a metal film, such as copper, liable to natural oxidation. Surface protection film 11 is formed using a silicon oxynitride film (SiON) or the like, so as to cover third wiring 14C. A contact plug and a wiring layer to be connected to a lower surface of each wiring may be formed using a dual damascene method and an aluminum reflow method, simultaneously with forming second wiring 14B and third wiring 14C.

After this, polyimide film 12 is formed on surface protection film 11, and then patterned. By etching using polyimide film 12 as a mask, first opening 50 is formed within surface protection film 11, so as to expose an upper surface of third wiring 14C. Seed layer 13 in which copper is deposited on a titanium (Ti) film is formed on the first principal surface side of semiconductor substrate 2 by sputtering.

Figure 2:
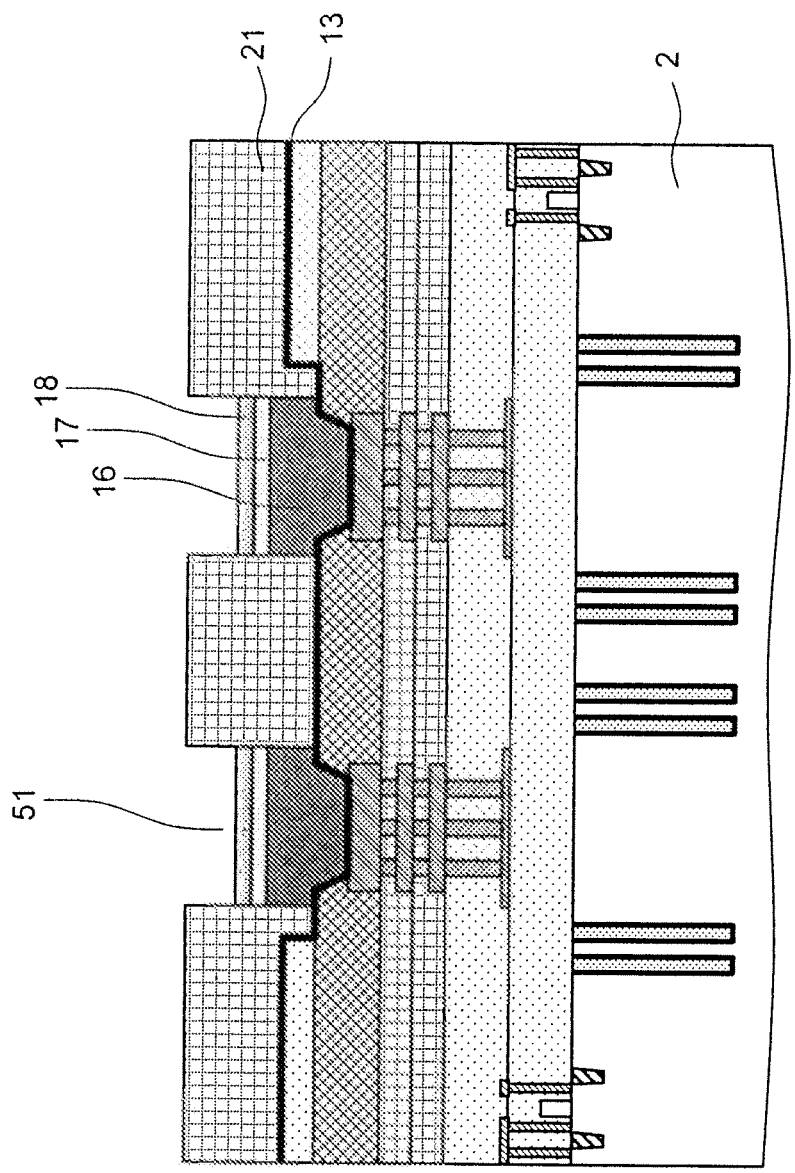

As illustrated in FIG. 2, photoresist 21 is formed on seed layer 13 on the first principal surface side of semiconductor substrate 2, and then patterned to form second opening 51 (an opening created here and first opening 50 are collectively referred to as second opening 51), so as to expose seed layer 13 provided within first opening 50. Using an electrolytic plating method, copper bump 16, Ni film 17 for preventing Cu diffusion, and Au film 18 for preventing Ni oxidation are formed in order on seed layer 13 within second opening 51. A front surface bump is composed of four layers composed of these seed layer 13, copper bump 16, Ni film 17, and Au film 18.

Figure 3:
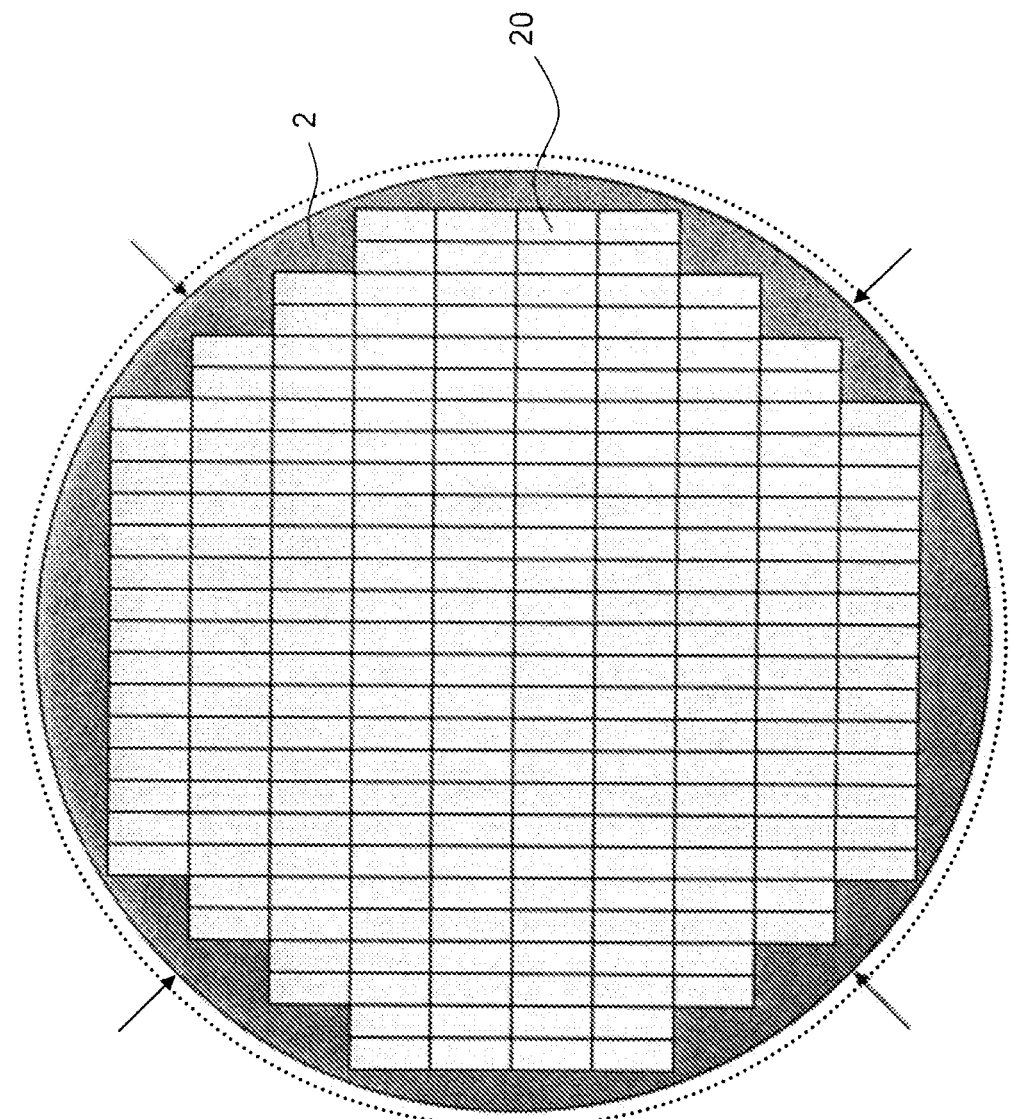

As illustrated in FIG. 3, an outer circumferential portion of semiconductor substrate 2 is ground to make the diameter of semiconductor substrate 2 smaller than the diameter of a WSS to which the substrate is bonded in a later step. In FIG. 3, reference numeral 20 denotes one chip-forming region. For example, semiconductor substrate 2 having a diameter of 300 mm is ground to reduce the diameter to 298.5 mm. Consequently, it is possible to prevent the substrate from being misaligned with the WSS when bonded thereto, or an adhesive agent from running off out of the WSS. In addition, it is possible to reduce the degree of the outer circumference of semiconductor substrate 2 after grinding becoming knife-edged.

Figure 4:
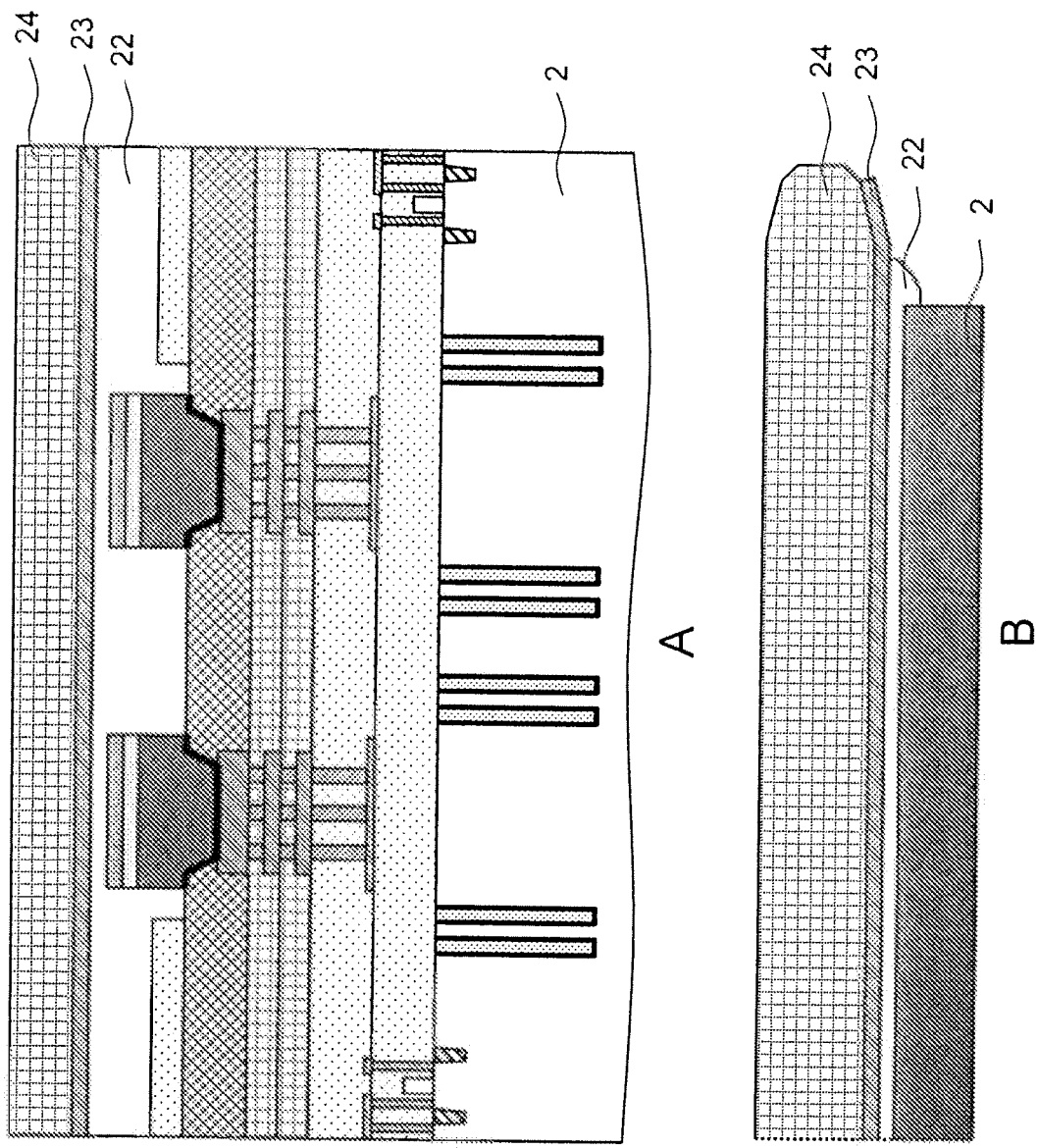

As illustrated in FIG. 4, photoresist 21 is removed, and then WSS 24 made of a supporting substrate made of acrylic resin, quartz or the like is bonded to the first principal surface side of semiconductor substrate 2 through adhesive agent 22 and LTHC film (light-to-heat conversion film) 23. FIG. 4A is a partial cross-sectional view representing the resulting structure, whereas FIG. 4B illustrates a schematic cross-sectional view in which an area wider than the area of FIG. 4A is shown in a simplified manner, in order to clarify the relationship among semiconductor substrate 2, adhesive agent 22, LTHC film 23, and WSS 24 (supporting substrate). Examples of the LTHC film 23 may include a film obtained by coating and drying a mixture of carbon powder and the adhesive agent, which can absorb laser light and convert the light into heat.

Hereafter, a manufacturing process according to the present exemplary embodiment will be described using cross-sectional views or schematic cross-sectional views, or both, on a case-by-case basis. In addition, each schematic cross-sectional view is shown, so that either the first principal surface or the second principal surface is on the upper side of the figure being discussed, depending on the content of description. The same is true on the second and subsequent exemplary embodiments.

As illustrated in FIG. 4B, WSS 24 overhangs semiconductor substrate 2 in the radial direction thereof toward the outer circumference side of the substrate 2, because the diameter of semiconductor substrate 2 has been made smaller by grinding in the step of FIG. 3. In addition, adhesive agent 22 and LTHC film 23 are provided also on the overhung portion of WSS 24 and are exposed thereon.

As illustrated in FIG. 5A, the second principal surface side of semiconductor substrate 2 is roughly ground using a whetstone abrasive (not shown in the figure) to thin the substrate down to a predetermined thickness. In the step of FIG. 5A, semiconductor substrate 2 is thin-filmed to a thickness of, for example, 775 μm to 100 μm. As illustrated in FIG. 5B, semiconductor substrate 2 is finely ground and thinned down to a predetermined thickness by using a whetstone abrasive (not shown in the figure). In the step of FIG. 5B, semiconductor substrate 2 is thin-filmed to a thickness of, for example, 100 μm to 40 or to 50 μm. After this, as illustrated in FIG. 5C, semiconductor substrate 2 is finish-ground and the exposed portion of LTHC film 23 is removed by a CMP method (chemical-mechanical polishing method). At this time, a mixture of a pH 10.6 aqueous solution containing silicon dioxide and an organic compound and a pH 12.3 aqueous solution containing inorganic salt, for example, is used as a slurry, and a polishing pad having a compressive elasticity modulus of 81.1% is used. This organic compound is added as a processing promotor and is a constituent intended to adjust a selection ratio and improve dispersibility. Examples of the organic compound may include a surface-activating agent. In addition, the inorganic salt is added as a processing promotor and is a constituent intended to make a pH adjustment, adjust a grinding rate, and improve dispersibility. Examples of the inorganic salt may include a pH adjuster, such as a buffering agent. The slurry and the polishing pad are not limited to those mentioned above, however. As the slurry, it is preferable to use a mixture of an aqueous solution containing silicon dioxide and an organic compound and having a pH value of 8 or larger but not larger than 12 and an aqueous containing inorganic salt and having a pH value of 10 or larger but not larger than 14. It is also preferable to use a polishing pad having a compressive elasticity modulus of 70% or higher but not higher than 90%. By this grinding step, a bottom of the initially formed insulating ring (not shown in the figure) is exposed on the second principal surface side of semiconductor substrate 2. In addition, in the step of FIG. 5C, neither the slurry nor the polishing pad has contact with a portion of LTHC film 23 underneath semiconductor substrate 2. Accordingly, this portion of LTHC film 23 is not removed.

Figure 6:
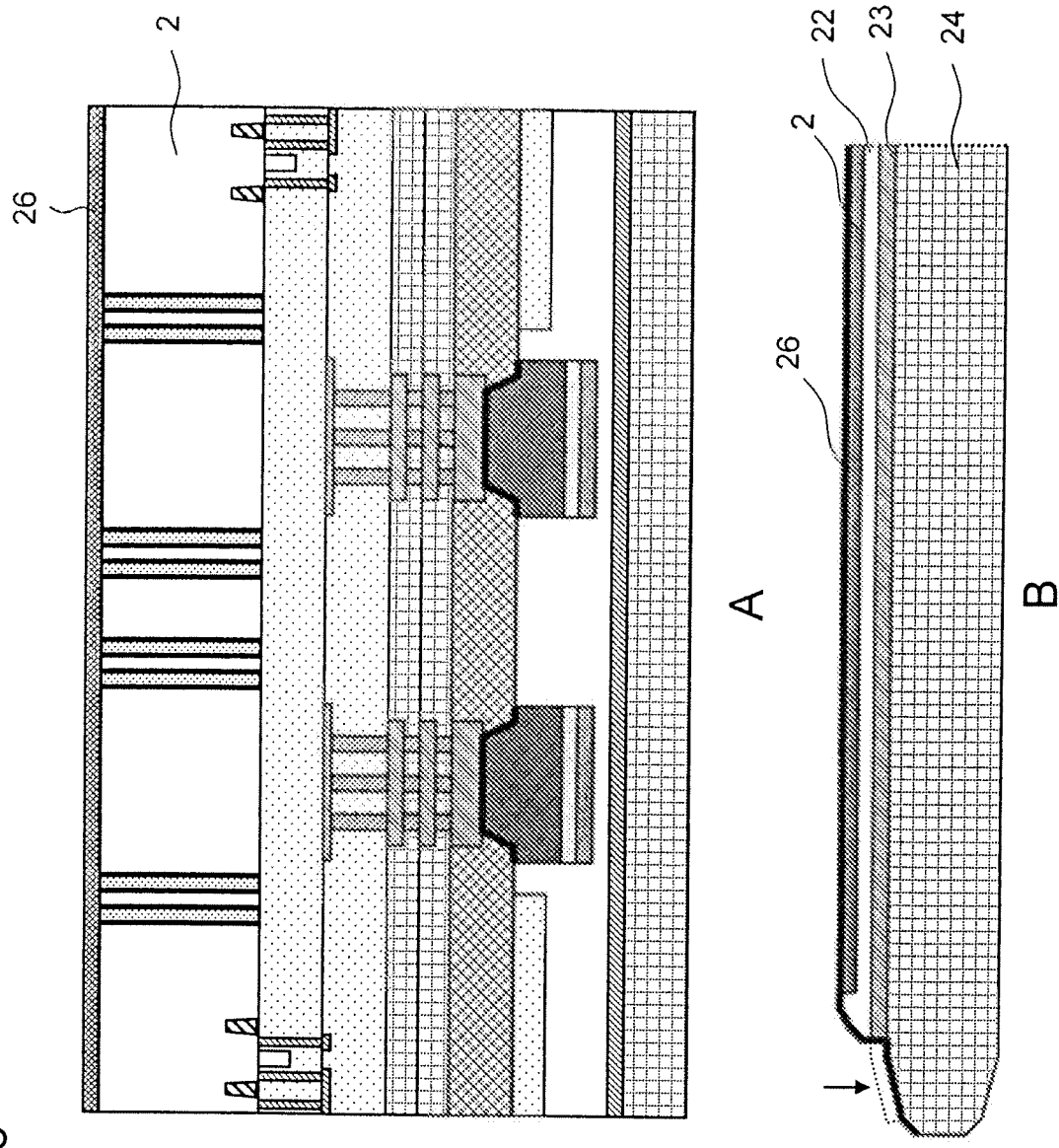

As illustrated in FIG. 6, semiconductor substrate 2 is cleaned using a brush or a chemical solution. Protective film 26 which is a silicon nitride film is formed to a thickness of 200 to 400 nm, so as to cover the second principal surface side of semiconductor substrate 2. This protective film 26 prevents copper used for a through silicon via plug to be formed in a later step from diffusing into semiconductor substrate 2 from the second principal surface side thereof during a manufacturing process and adversely affecting device characteristics (gettering effect).

Figure 7:
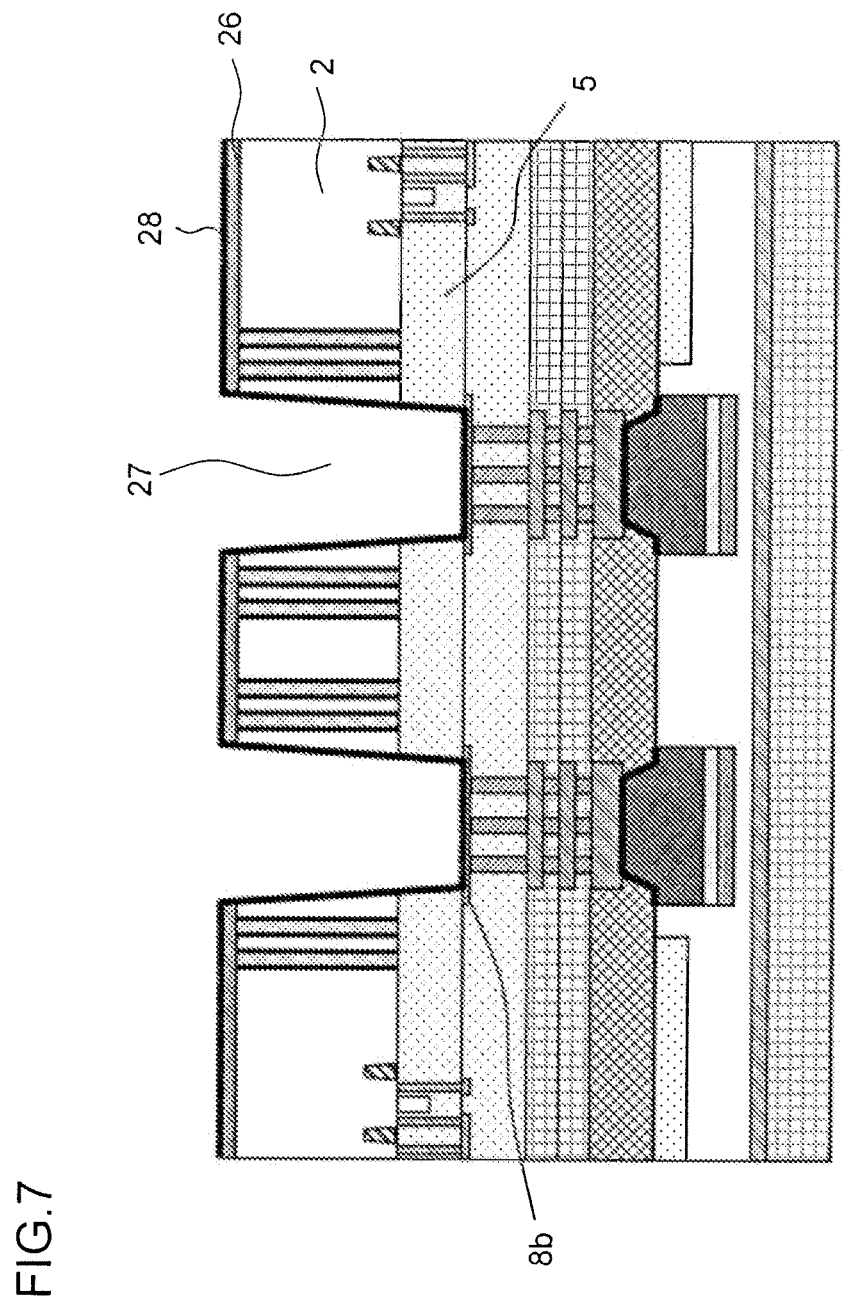

As illustrated in FIG. 7, third opening 27 is formed by anisotropic dry etching, so that the second principal surface side of local wiring 8b arranged in the through silicon via-forming region becomes exposed. Third opening 27 is formed using local wiring 8b as a stopper, so as to penetrate through protective film 26, semiconductor substrate 2, and first interlayer insulating film 5. Consequently, the second principal surface side of local wiring 8b becomes exposed at the bottom of third opening 27. At the time of dry etching for forming third opening 27, the silicon etching of semiconductor substrate 2 and the etching of first interlayer insulating film 5 may be performed separately from each other in two steps. Next, a titanium (Ti) film and a copper (Cu) film are deposited on the entire surface of semiconductor substrate 2 on the second principal surface side thereof, including third opening 27, by a sputtering method, thereby forming seed layer 28.

Figure 8:
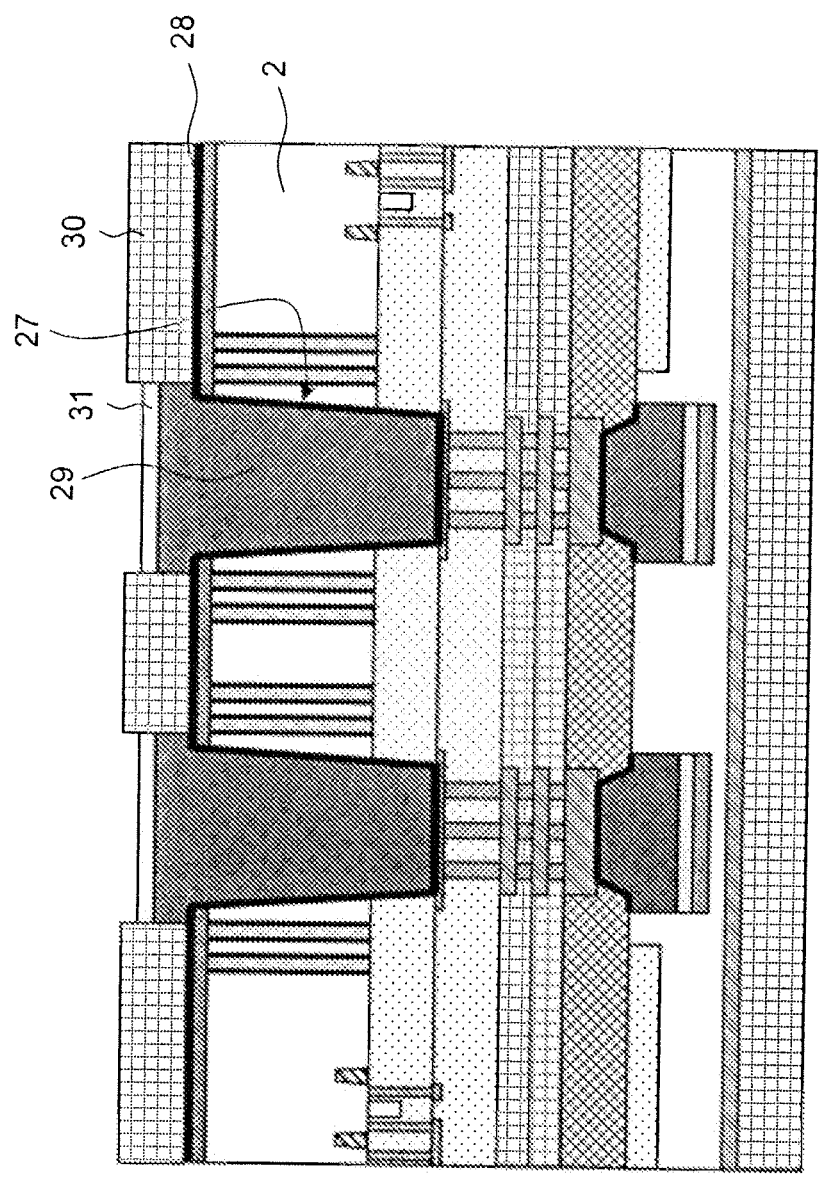

As illustrated in FIG. 8, photoresist pattern 30 including an opening in the same position as the position of third opening 27 is formed on the second principal surface side of semiconductor substrate 2. Using an electroplating method, copper bump 29 and solder film (SnAg film) 31 are formed in order within third opening 27. Solder film 31 is not limited to an SnAg film, however. Alternatively, it is possible to use, for example, an Au/Ni film in which Au is deposited on Ni. A rear surface bump (remaining part of the through silicon via) is formed of three layers composed of these seed layer 28, copper bump 29, and solder film 31.

Figure 9:
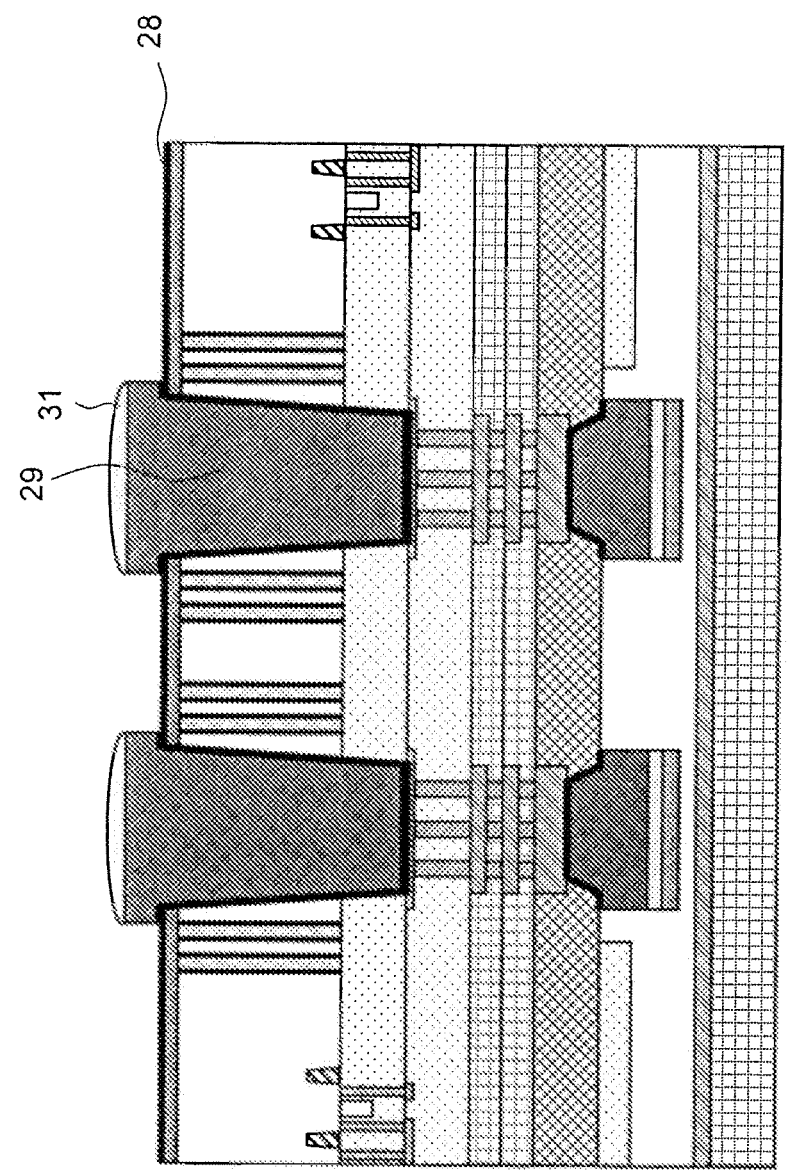
Figure 10:
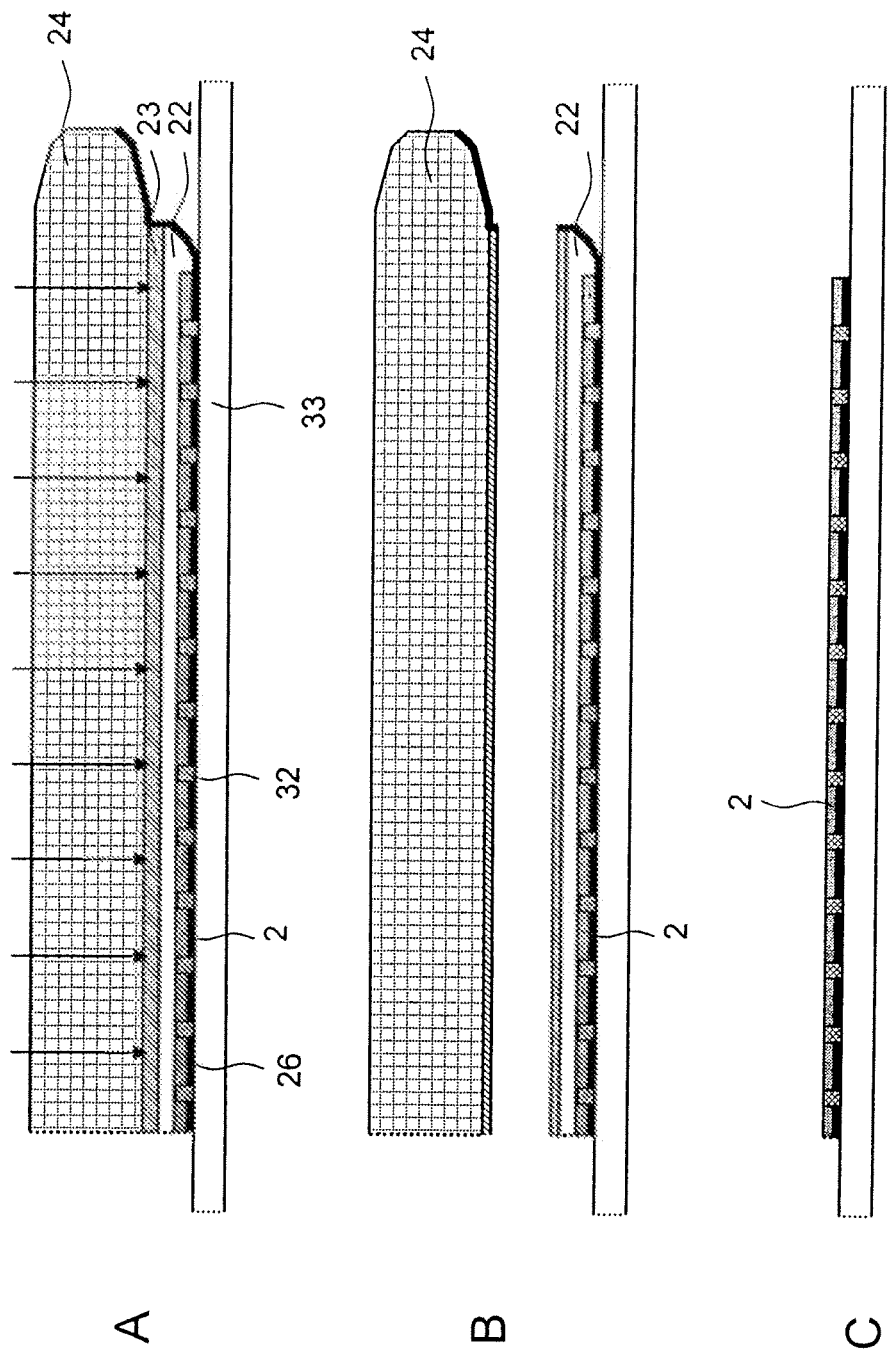

As illustrated in FIG. 9, photoresist pattern 30 is removed, and then exposed portions of seed layer 28 are removed. After this, a surface of solder film 31 is made convex by reflow.

As illustrated in FIG. 10A, dicing tape 33 is attached to semiconductor substrate 2 so as to have contact with protective film 26. A laser is irradiated through WSS 24 to LTHC film 23 from the first principal surface side (side on which WSS 24 is provided) of semiconductor substrate 2 to break away the bond-structure of LTHC film 23. If, for example, a film obtained by coating and drying a mixture of carbon powder and the adhesive agent is used as the LTHC film 23, light is absorbed by the carbon powder and converted into heat. Due to this heat, the temperature of an organic binder component binding the carbon powder runs up, and the organic binder component is degassed and carbonized, thus loosing binding power. As a result, almost the entirety of the LTHC film 23 changes to broken-apart carbon powder or carbon blocks. Consequently, as illustrated in FIG. 10B, WSS 24 is separated off from semiconductor substrate 2. As illustrated in FIG. 10C, adhesive agent 22 adhered to semiconductor substrate 2 is removed, and then dicing is performed on semiconductor substrate 2.

Figure 11:
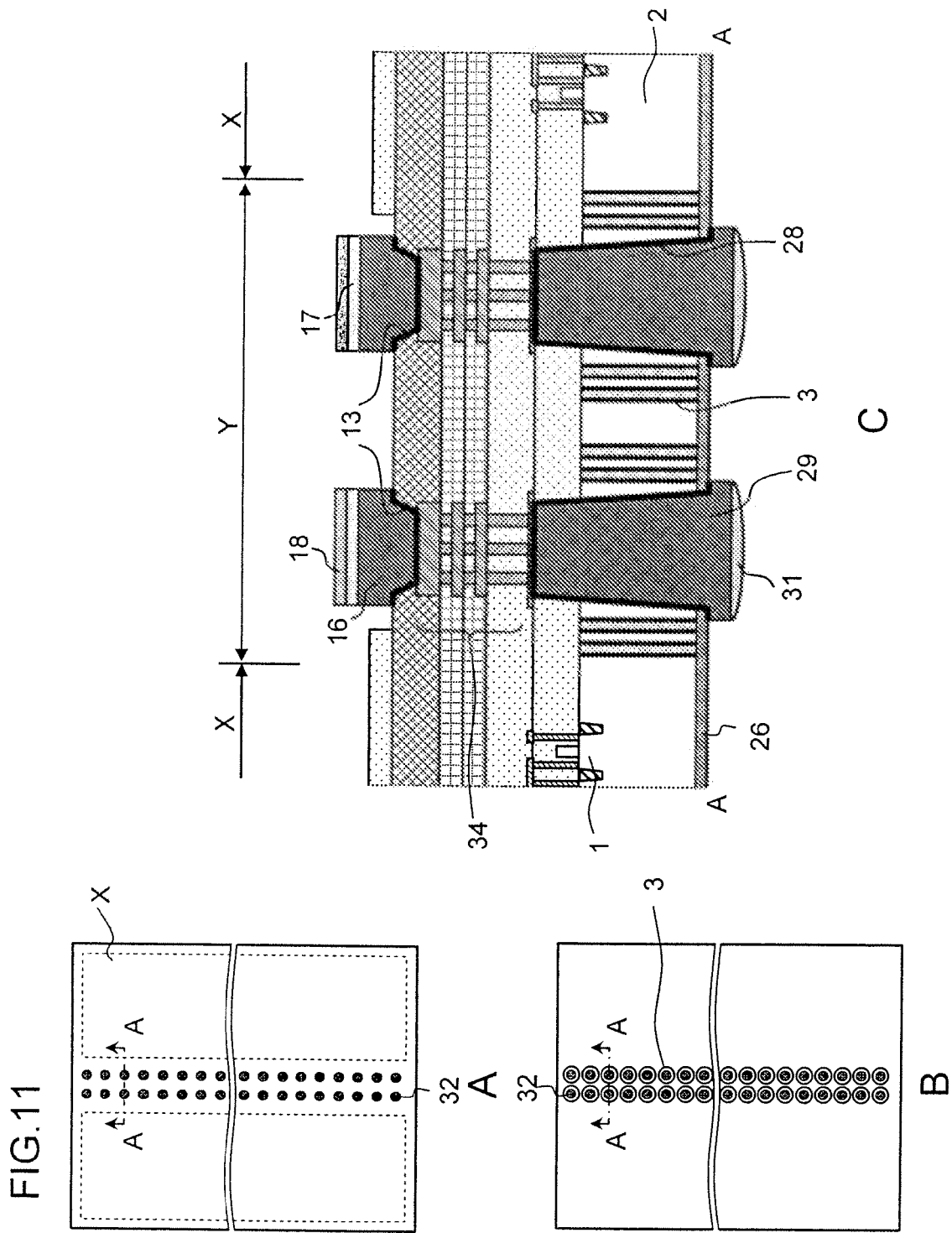

FIG. 11 is a schematic view representing a semiconductor chip obtained after dicing. FIG. 11A is a plan view of the semiconductor chip taken from the first principal surface (front surface) side, whereas FIG. 11B is a plan view of the semiconductor chip taken from the second principal surface (rear surface) side. However, FIGS. 11A and 11B illustrate only the principal structural parts, such as through silicon vias. In addition, FIG. 11C illustrates a cross-sectional view taken along the A-A direction of FIGS. 11A and 11B. As illustrated in FIG. 11, the semiconductor chip includes element region X in which element 1, such as an MIS transistor, is formed, and through silicon via region Y in which a plurality of through silicon vias are formed. Each through silicon via includes bumps (protruding electrodes) for connection at the upper and lower ends thereof. When a plurality of semiconductor chips are stacked, semiconductor chips arranged on top of each other are electrically connected to each other by way of the through silicon vias. Each through silicon via comprises a through-hole plug (front and rear surface bumps) penetrating through semiconductor substrate 2, a contact plug penetrating through a plurality of interlayer insulating films on the semiconductor substrate 2, and a wiring layer. Insulating ring 3 is provided around a portion of each through silicon via buried in semiconductor substrate 2. This insulating ring ensures insulation between individual through silicon via and other through silicon vias and between individual through silicon via and element 1.

A rear surface bump is formed on an end of each through silicon via on the second principal surface side of semiconductor substrate 2. The rear surface bump is formed of three layers composed of seed layer 28, copper bump 29, and solder film 31. A front surface bump is formed on an end of each through silicon via on the first principal surface side of semiconductor substrate 2. The front surface bump is formed of four layers composed of seed layer 13, copper bump 16, Ni film 17, and Au film 18. The rear surface bump and the front surface bump are connected to each other by a contact plug and wiring layer 34. The rear surface bump is joined to a front surface bump provided in a lower-layer chip when a plurality of semiconductor chips are stacked. The front surface bumps and the rear surface bumps of the through silicon vias are connected to each other, and though not illustrated, each through silicon via may include internal wiring such that the through silicon via is electrically connected to an element, such as an MIS (Metal Insulator Semiconductor) transistor, by using any one of local wiring, first wiring, second wiring and third wiring.

Figure 12:
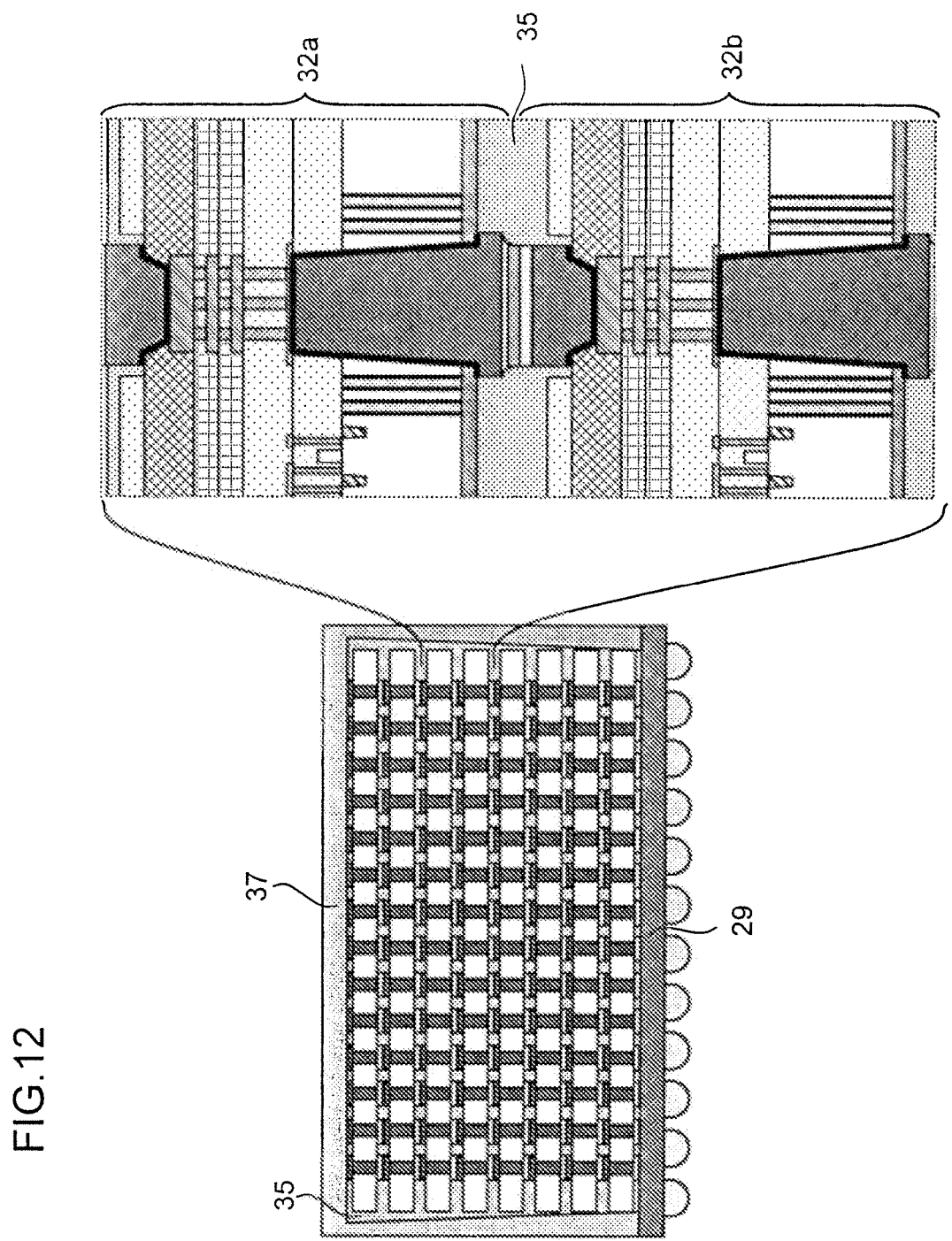

As illustrated in FIG. 12, a plurality of semiconductor chips 32a, 32b and the like are mounted, so that the front and rear surface bumps of different semiconductor chips have contact with each other. The solder films of respective front and rear surface bumps are jointed to each other by reflow. After underfill 35 is filled between semiconductor chips, a plurality of semiconductor chips are mounted on package substrate 39. After this, molding is performed using molding resin 37, thereby completing the semiconductor device according to the present exemplary embodiment. Examples of the semiconductor device of the present exemplary embodiment may include memory devices, such as a DRAM (Dynamic Random Access Memory), an SRAM (Static Random Access Memory) and a flash memory, and arithmetic processing devices, such as an MPU (Micro Processing Unit) and a DSP (Digital Signal Processor).

If a semiconductor device is manufactured by applying a conventional method in which portions of an LTHC film exposed on a WSS are not removed, the LTHC film remains exposed in the vicinity of the semiconductor device. This means that LTHC film-derived contaminants stick to a semiconductor substrate. Accordingly, if the contaminants are not removed by the time a protective film is formed on the second principal surface of the semiconductor substrate, the contaminants are introduced into portions of the semiconductor substrate under the protective film. It has therefore been difficult to remove the contaminants in a later step.

Figure 5:
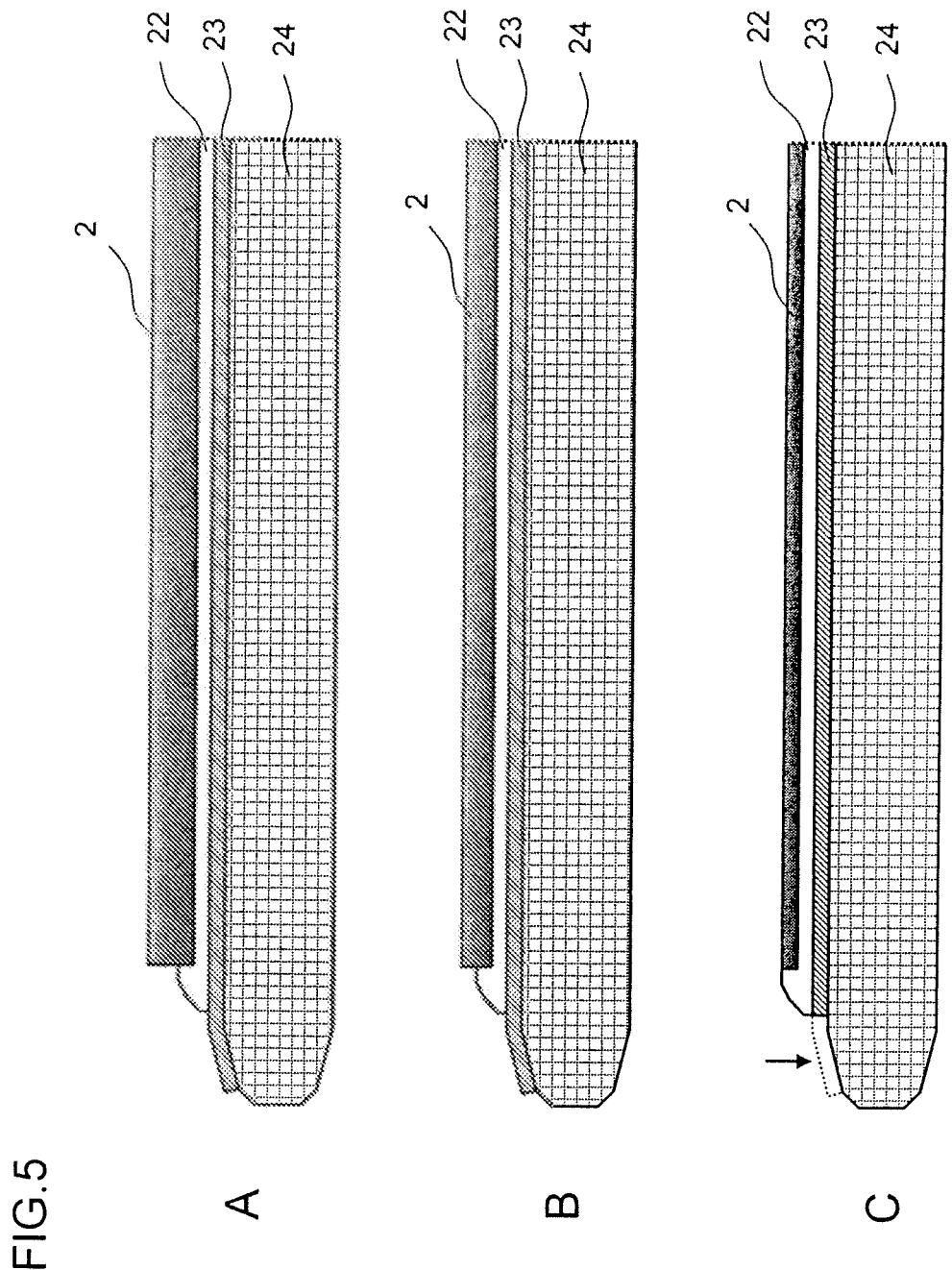

In contrast, in the present exemplary embodiment, portions of LTHC film 23 exposed on WSS 24 are removed in the step of FIG. 5 as an anti-contamination process. By this process, LTHC film 23 is not exposed in the vicinity of semiconductor substrate 2 after cleaning in the step of FIG. 6. As a result, it is possible to reduce the possibility of the LTHC film-derived contaminants (e.g., metal, such as Fe, and organic matter) being introduced into portions of semiconductor substrate 2 under protective film 26. In addition, in the present exemplary embodiment, exposed portions of LTHC film 23 are removed in a CMP step carried out finally in the grinding step of FIG. 5. Accordingly, any steps for removing LTHC film 23 need not be added particularly, and therefore, a manufacturing process can be simplified.

Modified Example

The present modified example differs from the first exemplary embodiment in that each through silicon via is isolated from another through silicon via and element 1 by forming an insulating film on an inner surface of third opening 27, instead of forming such insulating ring 3 as shown in FIG. 11.

Figure 13:
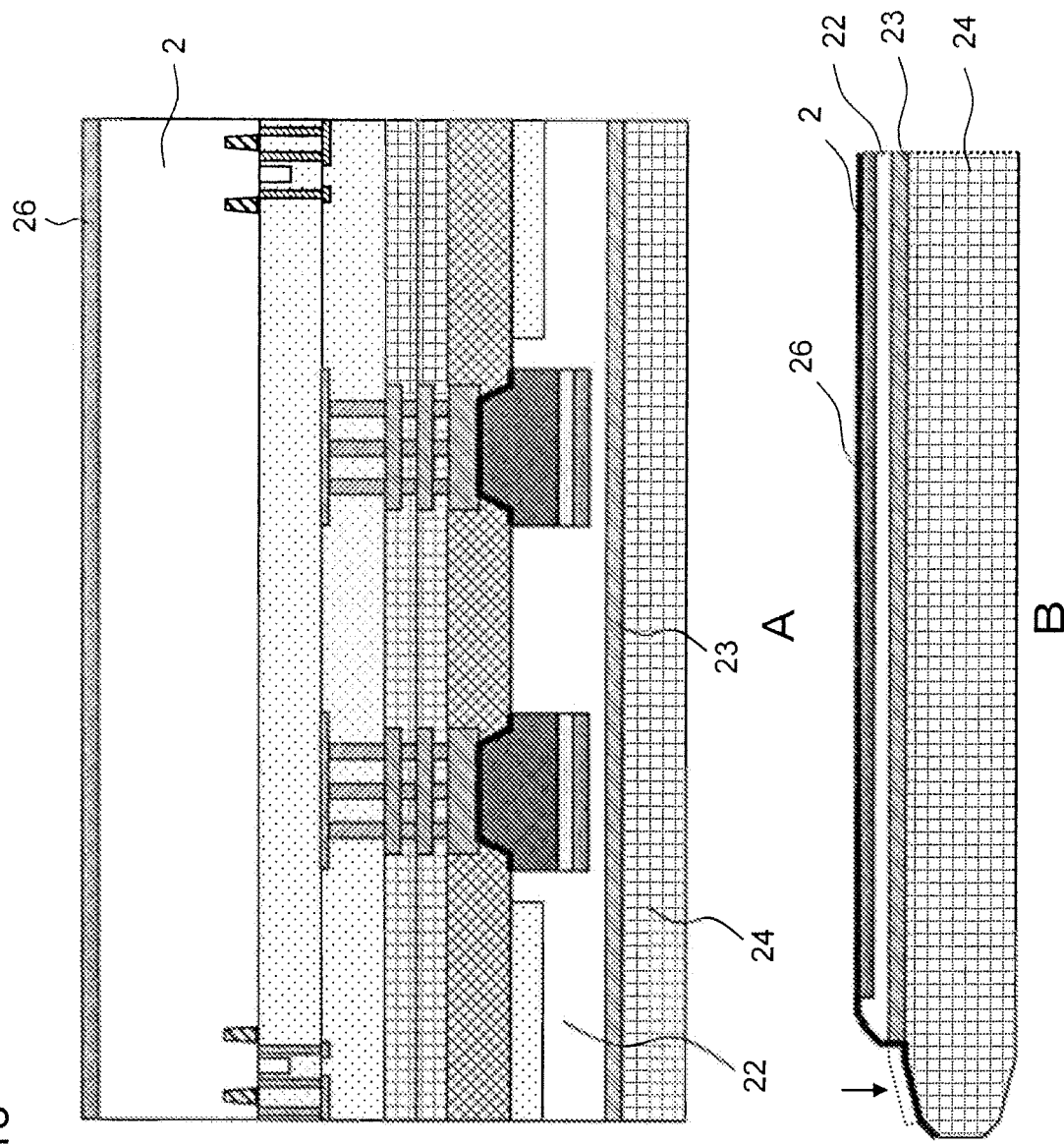

In the present modified example, steps up to the step of FIG. 6 are carried out in the same way as in the first exemplary embodiment, except that the insulating ring is not formed in the step of FIG. 1. FIG. 13 is a cross-sectional view representing the resulting structure.

Figure 14:
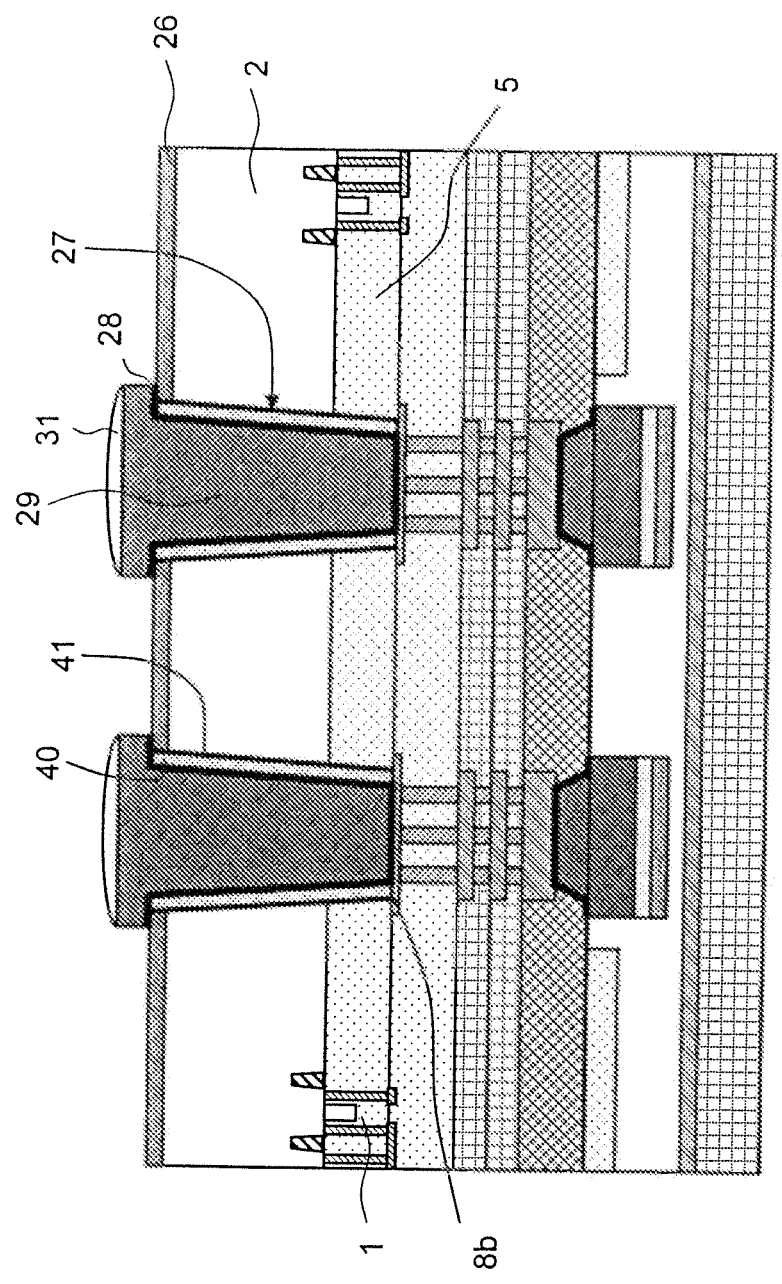
FIG. 14 is a schematic view illustrating one step of a modified example of the first exemplary embodiment.

As illustrated in FIG. 14, third opening 27 is formed, so as to penetrate through protective film 26 which is a silicon nitride film, semiconductor substrate 2 and first interlayer insulating film 5, and expose local wiring 8b. Using a CVD method, silicon nitride film 41 and silicon oxide film 40 are formed in order on an inner surface of third opening 27 on the second principal surface side of semiconductor substrate 2. By performing etch-back, silicon nitride film 41 and silicon oxide film 40 to serve as insulating films of each through silicon via are left over on an inner side surface of third opening 27. After this, seed layer 28 is formed on the entire second principal surface of semiconductor substrate 2 by a sputtering method. Subsequent steps are the same as those in the first exemplary embodiment, and therefore, will not be described here. In the present modified example, each through silicon via is isolated from another through silicon via and element 1 by silicon nitride film 41 and silicon oxide film 40 provided on a side surface of copper bump 29.

The present modified example is the same in the step of removing LTHC film 23 as the first exemplary embodiment. Accordingly, by a simplified step, it is possible to reduce the possibility of any LTHC film 23-derived contaminants being introduced into portions of semiconductor substrate 2 under protective film 26 in the same way as in the first exemplary embodiment.

(Second Embodiment)

The present exemplary embodiment differs from the first exemplary embodiment in that exposed portions of LTHC film 23 are easy to be removed by newly adding a step of performing laser irradiation. Hereinafter, a manufacturing method of the present exemplary embodiment will be described, but the description of the same steps as those of the first exemplary embodiment will be omitted.

Figure 15:
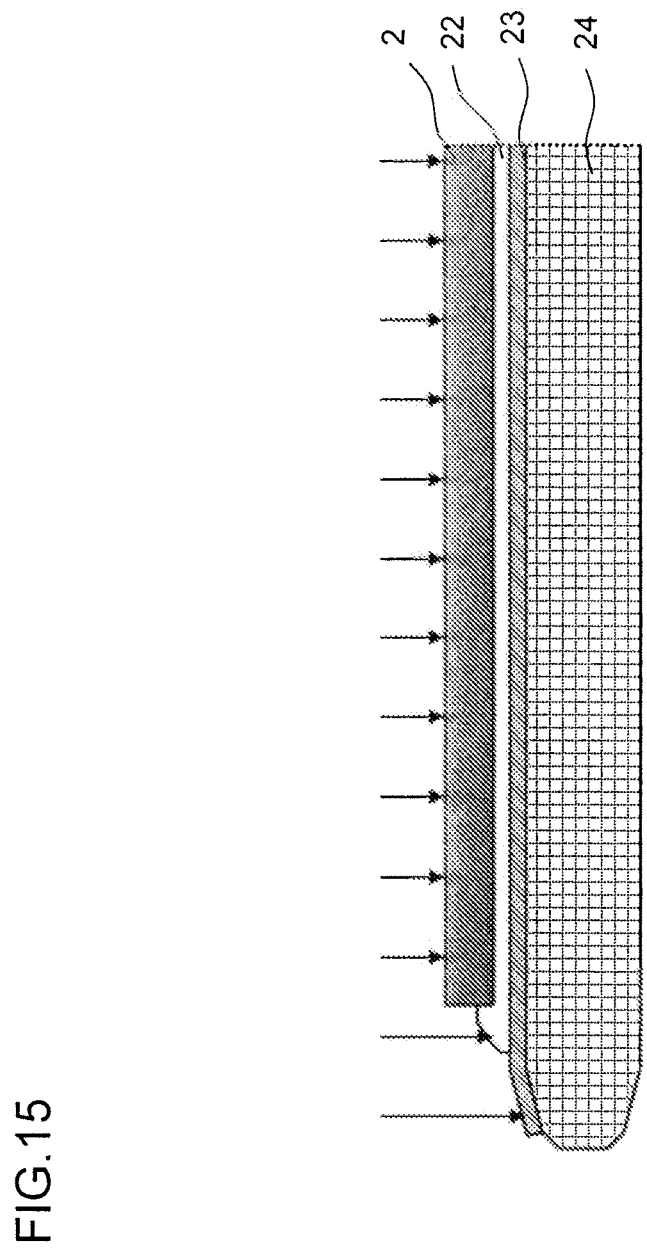
FIG. 15 is a schematic view illustrating one step of a semiconductor device manufacturing method according to a second exemplary embodiment.

First, steps up to the step of FIG. 4 in the first exemplary embodiment are carried out. Next, as illustrated in FIG. 15, a laser is irradiated from the second principal surface side of semiconductor substrate 2. At this time, semiconductor substrate 2 serves as a mask for laser irradiation. Consequently, the laser can be irradiated to the exposed portions of LTHC film 23 in a self-aligned manner to break away the bond-structure of the exposed portions of LTHC film 23. As this laser, there is applied, for example, a YV04 laser obtained by oscillating a laser having the same wavelength (for example, a wavelength of 136 nm) as a YAG (Yttrium-Aluminum-Garnet) laser in a pulsed manner at an output power of 25 W. By this laser irradiation, the exposed portions of LTHC film 23 can be easily removed in a later step. On the other hand, the laser does not transmit through semiconductor substrate 2 to the first principal surface side thereof, because semiconductor substrate 2 is thick. Accordingly, the bond-structure of portions of LTHC film 23 under semiconductor substrate 2 is not broken away.

The step of FIG. 5 and subsequent steps in the first exemplary embodiment are carried out. At this time, the exposed portions of LTHC film 23 irradiated with the laser in the step of FIG. 15 have become structurally brittle. Consequently, the exposed portions of LTHC film 23 are readily removed in at least one step among the rear surface grinding steps of FIGS. 5A and 5B, the CMP step of FIG. 5C, and the cleaning step of FIG. 6. That is, the exposed portions of LTHC film 23 are removed in the rear surface grinding steps of FIGS. 5A and 5B, in the CMP step of FIG. 5C or in the cleaning step of FIG. 6, or in a plurality of steps among these steps.

In the present exemplary embodiment, the exposed portions of LTHC film 23 are treated in the step of FIG. 15, so as to be easy to be removed. Then, these portions are removed in the steps of FIGS. 5 and 6. Consequently, LTHC film 23 does not become exposed in the vicinity of semiconductor substrate 2 after cleaning in the step of FIG. 6, as in the first exemplary embodiment. As a result, it is possible to reduce the possibility of any LTHC film 23-derived contaminants (e.g., metal, such as Fe, and organic matter) being introduced into portions of semiconductor substrate 2 under protective film 26. In addition, according to the present exemplary embodiment, laser light is not allowed to transmit to regions underneath semiconductor substrate 2 by irradiating the laser light from the semiconductor substrate 2 side before the step of FIG. 5. Consequently, the laser light can be irradiated only to the portions of LTHC film 23 exposed on WSS (supporting substrate) 24 in a self-aligned manner, without adversely affecting a portion of LTHC film 23 underneath semiconductor substrate 2. In other words, laser light can be selectively irradiated only to the portions of LTHC film 23 exposed on WSS 24 by directly applying laser irradiation conditions conventionally used in a step of separating off WSS 24 and irradiating the laser light from the semiconductor substrate 2 side under these conditions.

Modified Examples

Hereinafter, a plurality of modified examples of the second exemplary embodiment will be described. In the second exemplary embodiment, a laser is irradiated to the exposed portions of LTHC film 23 before the step of FIG. 5, and then the exposed portions of LTHC film 23 are removed in the steps of FIGS. 5 and 6. In contrast, in the below-described modified examples, the exposed portions of LTHC film 23 are not removed in the step of FIG. 5C. Alternatively, a laser is irradiated to the exposed portions of LTHC film 23 after the step of FIG. 5C. In addition, the modified examples differ from the second exemplary embodiment in that the exposed portions of LTHC film 23 are removed in the step of FIG. 6.

Specifically, as a step common to the respective modified examples, a CMP method is implemented under such conditions as not to remove the exposed portions of LTHC film 23 after steps up to the step of FIG. 5B in the first exemplary embodiment are carried out, thereby polishing the second principal surface of semiconductor substrate 2. After this, the laser is irradiated to the exposed portions of LTHC film 23 in a different way for each modified example. Laser irradiation conditions at this time may be set to the same conditions as those in the second exemplary embodiment. However, the conditions may be varied as appropriate, according to the steps of each modified example.

Next, as steps common to the respective modified examples, the step of FIG. 6 and subsequent steps in the first exemplary embodiment are carried out. At this time, the bond-structure of the laser-irradiated exposed portions of LTHC film 23 has been broken away, and is therefore brittle. Thus, the exposed portions are readily removed in the cleaning step of FIG. 6. Hereinafter, a description will be given of only a step of laser irradiation to the exposed portions of LTHC film 23 which differs among the respective modified examples.

In a first modified example, a laser is irradiated from the second principal surface side of semiconductor substrate 2, as illustrated in FIG. 16A. At this time, the laser is irradiated only to the exposed portions of LTHC film 23 by setting such conditions as not to allow the laser to transmit through semiconductor substrate 2 thinned after polishing.

In a second modified example, as illustrated in FIG. 16B, masking blade (protective member) 42 is provided between semiconductor substrate 2 and a laser light source, so as to cover the second principal surface of semiconductor substrate 2 and adhesive agent 22. Under this condition, a laser is irradiated from the second principal surface side of semiconductor substrate 2. As a result, the laser is irradiated only to the exposed portions of LTHC film 23. Next, masking blade 42 is removed. In the second modified example, since masking blade 42 prevents the laser from transmitting therethrough, it is possible to reduce the effect of laser irradiation on semiconductor substrate 2.

In a third modified example, as illustrated in FIG. 16C, a laser is selectively irradiated only to exposed portion 43 of LTHC film 23 (portion surrounded by a dotted line) from the second principal surface side of semiconductor substrate 2.

In a fourth modified example, as illustrated in FIG. 17A, masking blade (protective member) 42 is provided between semiconductor substrate 2 and a laser light source, so as to cover a region of WSS 24 corresponding to the first principal surface of semiconductor substrate 2 and adhesive agent 22. A laser is irradiated from the first principal surface side (surface on the opposite side of a surface of semiconductor substrate 2 bonded to WSS 24) of semiconductor substrate 2 to the exposed portions of LTHC film 23. As a result, the laser is irradiated only to the exposed portions of LTHC film 23. Next, masking blade 42 is removed. In the fourth modified example, since masking blade 42 prevents the laser from transmitting therethrough, it is possible to reduce the effect of laser irradiation on semiconductor substrate 2.

In a fifth modified example, as illustrated in FIG. 17B, a laser is selectively irradiated only to exposed portion 43 of LTHC film 23 (portion surrounded by a dotted line) from the first principal surface side (surface on the opposite side of a surface of semiconductor substrate 2 bonded to WSS 24) of semiconductor substrate 2.

In the fourth and fifth modified examples, a material made primarily of glass transmissive to the laser can be used as WSS 24.

Figure 16:
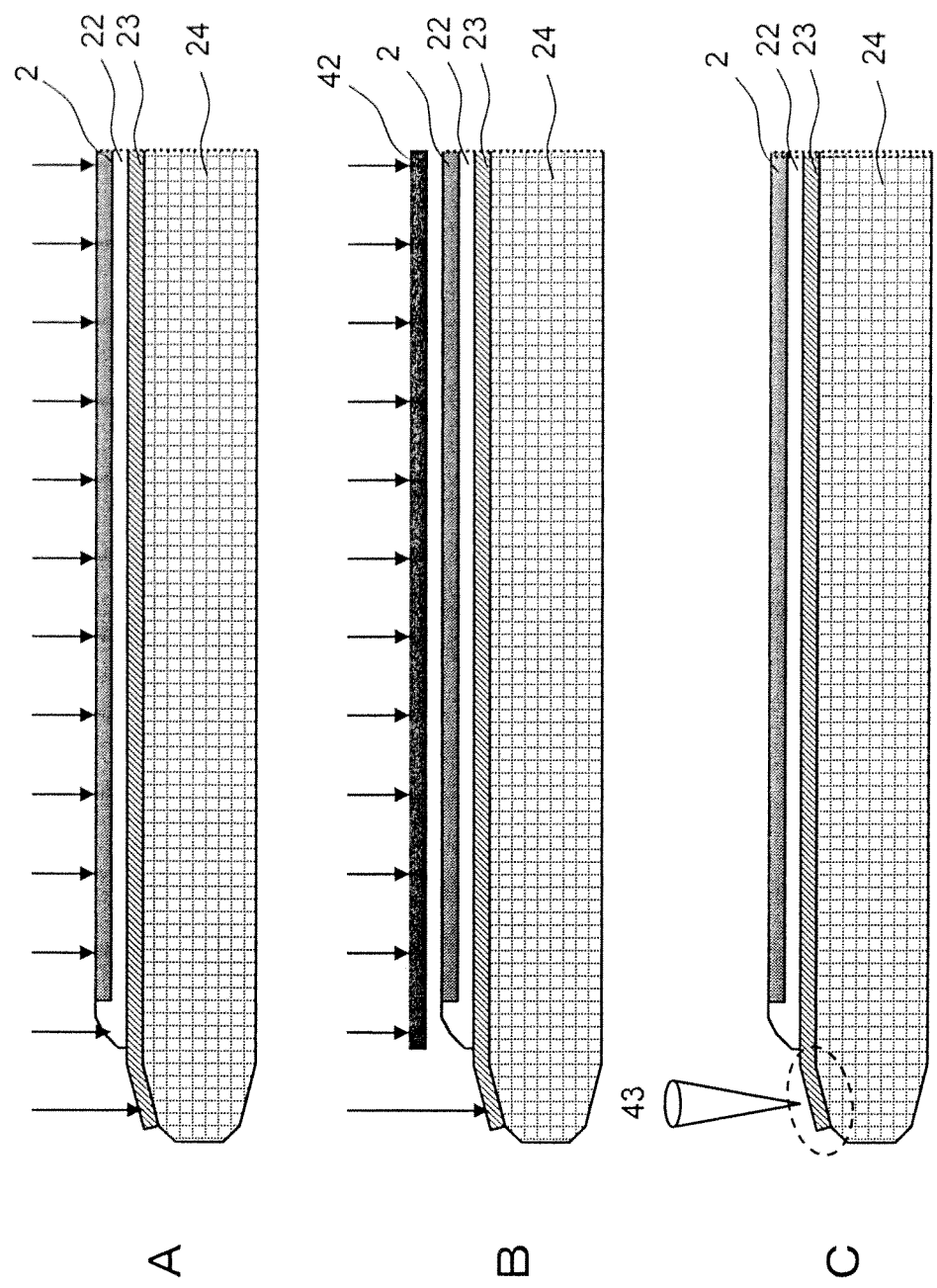
FIGS. 16 and 17 are schematic views illustrating one step of a modified example of the second exemplary embodiment.
Figure 17:
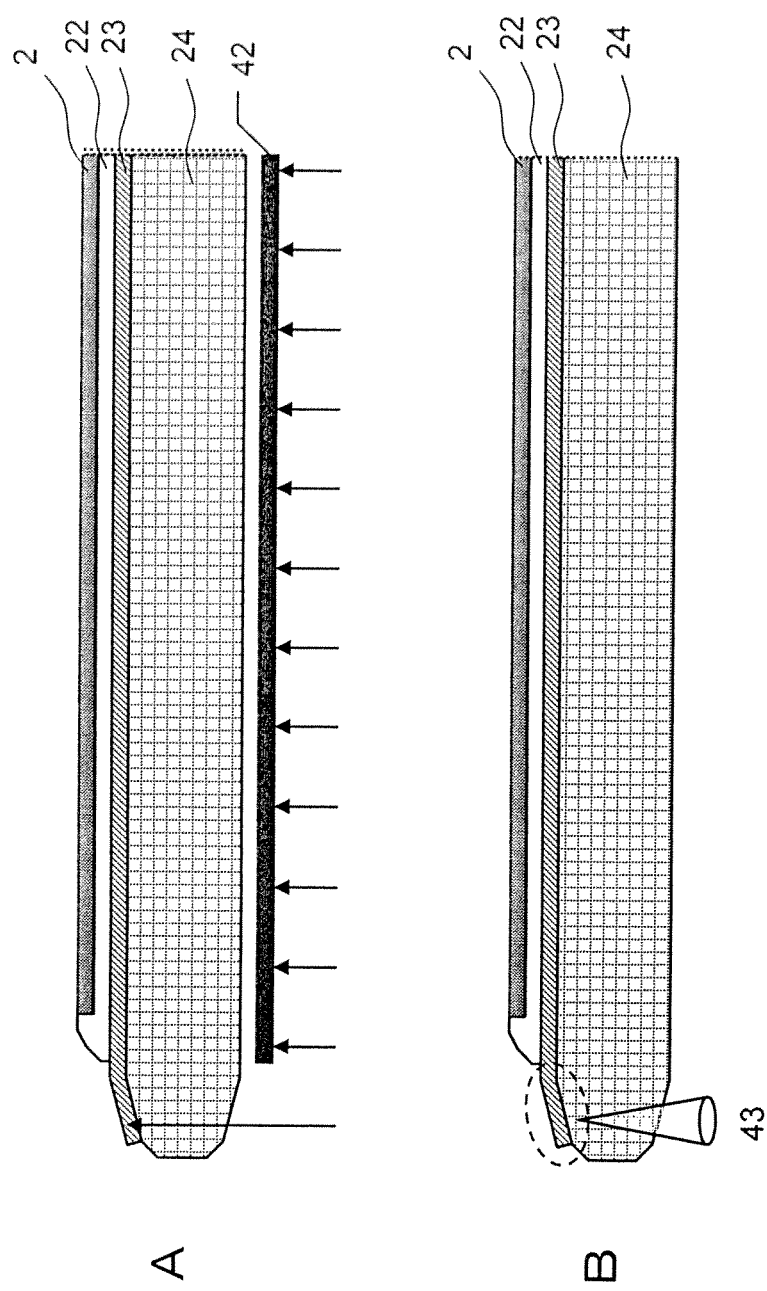

In the above-described respective modified examples, the laser is irradiated to the exposed portions of LTHC film 23 in the steps of FIGS. 16 and 17 to make these portions easy to be removed. Then, these portions are removed in the step of FIG. 6. Consequently, it is possible to reduce the possibility of any LTHC film 23-derived contaminants being introduced into portions of semiconductor substrate 2 under protective film 26, as in the second exemplary embodiment. In addition, laser light can be irradiated only to the portions of LTHC film 23 exposed on WSS 24 in a self-aligned manner, without adversely affecting a portion of LTHC film 23 under semiconductor substrate 2.

(Third Embodiment)

The present exemplary embodiment differs from the first exemplary embodiment in that a step of coating a first chemical on the exposed portions of LTHC film 23 is newly added. Hereinafter, a manufacturing method according to the present exemplary embodiment will be described, but the description of steps the same as those of the first exemplary embodiment will be omitted.

Figure 18:
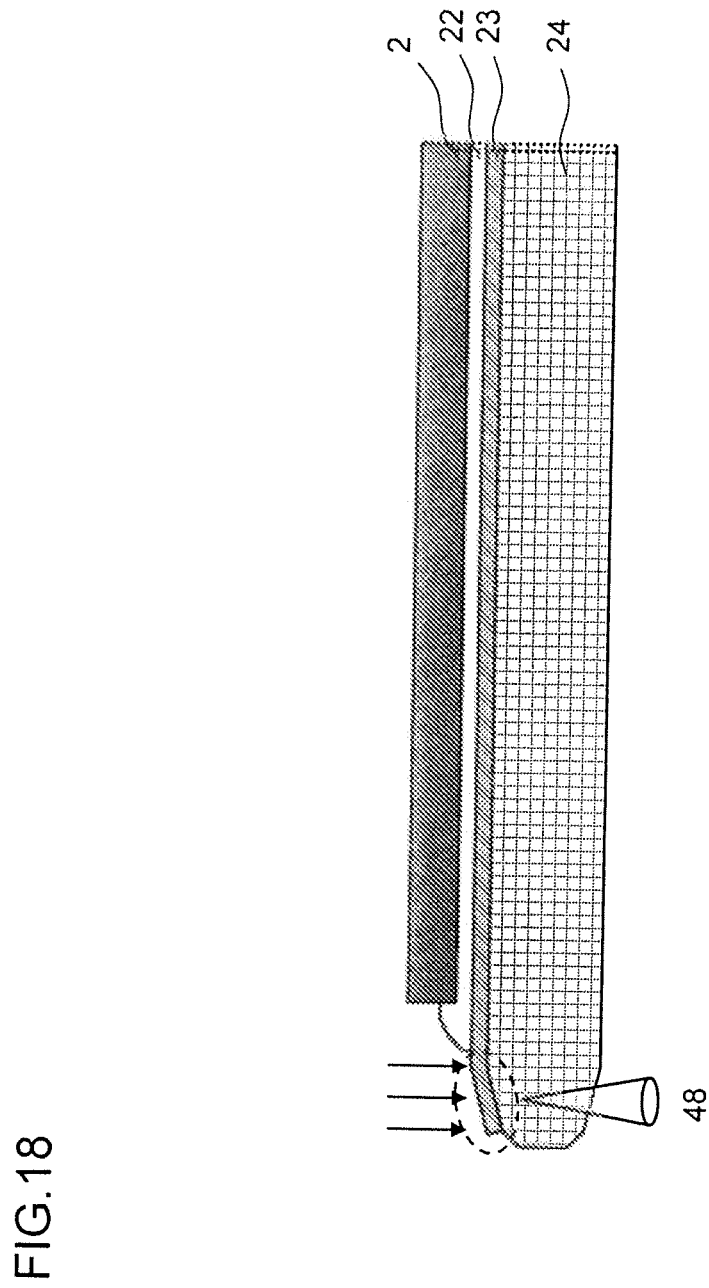
FIG. 18 is a schematic view illustrating one step of a semiconductor device manufacturing method according to a third exemplary embodiment.

Steps up to the step of FIG. 4 in the first exemplary embodiment are carried out. Next, as illustrated in FIG. 18, a first chemical is coated on exposed portion 43 of LTHC film 23 (portion surrounded by a dotted line). The first chemical is preferably a chemical composed primarily of ammonia and a hydrogen peroxide aqueous solution.

The step of FIG. 5 and subsequent steps in the first exemplary embodiment are carried out. At this time, exposed portion 43 of LTHC film 23 coated with the first chemical in the step of FIG. 18 has been made easy to remove. Accordingly, exposed portion 43 of LTHC film 23 is readily removed at least in some steps, among the rear surface grinding steps of FIGS. 5A and 5B, the CMP step of FIG. 5C and the cleaning step of FIG. 6. That is, exposed portion 43 of LTHC film 23 is removed in the rear surface grinding steps of FIGS. 5A and 5B, in the CMP step of FIG. 5C or in the cleaning step of FIG. 6, or in a plurality of steps among these steps. The exposed portion 43 of LTHC film 23 may be removed before the steps of FIGS. 5 and 6 or partway through these steps by introducing a manual separation step based on a human hand or a machine.

(Fourth Embodiment)

The present exemplary embodiment differs from the first exemplary embodiment in that cover film 25 is newly formed on the exposed portions of LTHC film 23. Hereinafter, a manufacturing method of the present exemplary embodiment will be described, but the description of steps the same as those of the first exemplary embodiment will be omitted.

Figure 19:
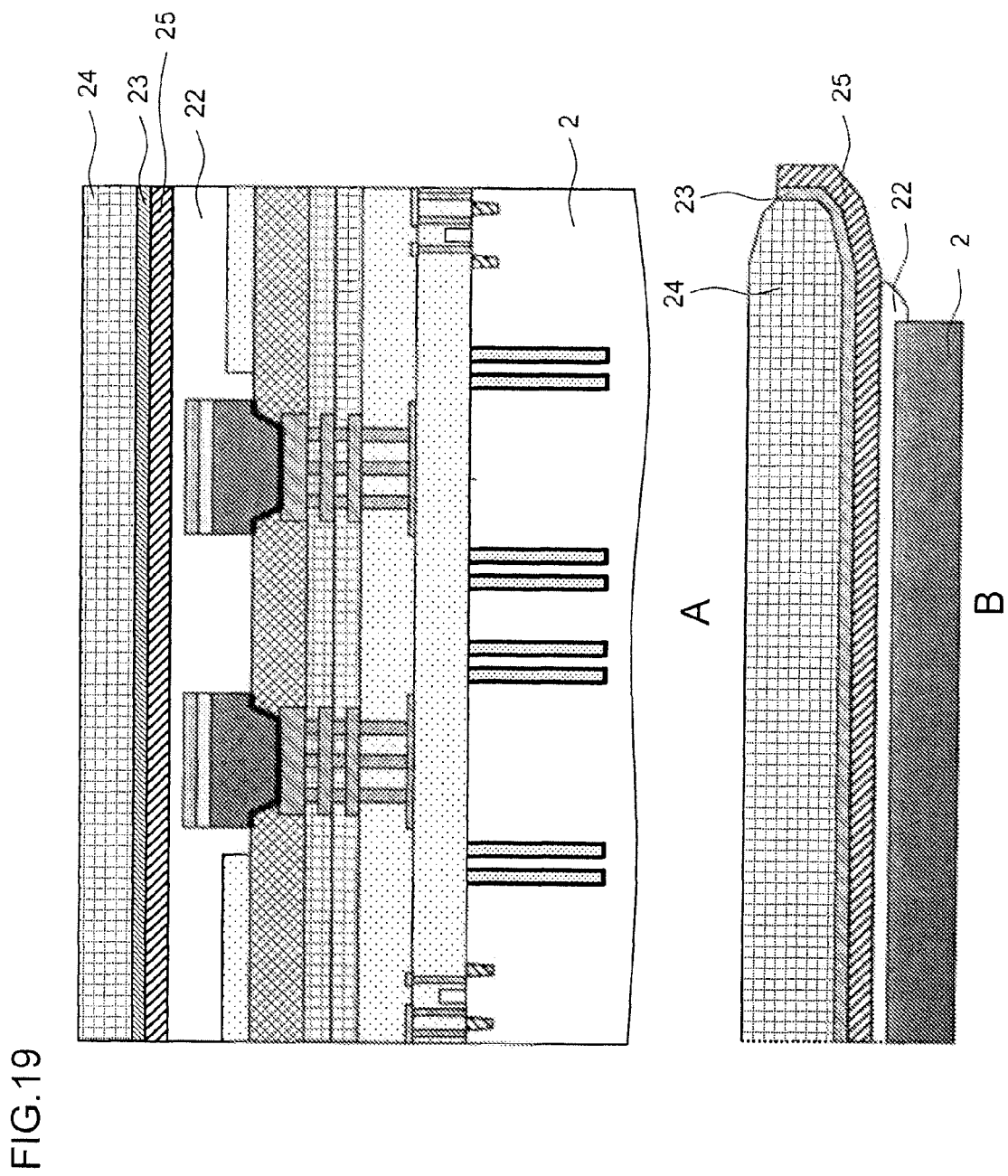
FIGS. 19 and 20 are schematic views illustrating one step of a semiconductor device manufacturing method according to a fourth exemplary embodiment.

Steps up to the step of FIG. 3 in the first exemplary embodiment are carried out. Next, as illustrated in FIG. 19, photoresist 21 is removed. Thereafter, WSS 24 is bonded to the first principal surface side of semiconductor substrate 2 through adhesive agent 22. LTHC film (light-to-heat conversion film) 23 is formed on WSS (supporting substrate) 24 made of acrylic resin, quartz or the like, and cover film 25 is formed on LTHC film 23 and contacts with adhesive agent 22. FIG. 19A is a partial cross-sectional view representing the resulting structure, whereas FIG. 19B illustrates a schematic cross-sectional view in which an area wider than the area of FIG. 19A is shown in a simplified manner, in order to clarify the relationship among semiconductor substrate 2, adhesive agent 22, cover film 25, LTHC film 23, and WSS 24 (supporting substrate). Examples of cover film 25 may include a polyimide film.

As illustrated in FIG. 19B, LTHC film 23 is provided so as to cover up to a beveled portion which is an end of WSS 24. In addition, cover film 25 is provided up to the beveled portion to a thickness of 1 μm to 5 μm, so as to cover LTHC film 23.

Next, the steps of FIGS. 5 and 6 in the first exemplary embodiment are carried out. At this time, the rear surface grinding steps of FIGS. 5A and 5B, the CMP step of FIG. 5C, and the cleaning step of FIG. 6 can be set to the same conditions as those in the first exemplary embodiment. However, the conditions may be varied as appropriate, according to the state of formation of cover film 25. Since LTHC film 23 is covered with cover film 25 at this time and cover film 25 remains without being removed even if it is treated by a CMP method in the step of FIG. 5C, LTHC film 23 remains without being exposed. The same is true on the cleaning step of FIG. 6.

Next, the steps of FIGS. 7 to 9 in the first exemplary embodiment are carried out. Next, as illustrated in FIG. 20A, dicing tape 33 is attached to semiconductor substrate 2 so as to have contact with protective film 26. The laser is irradiated from the first principal surface side (side on which WSS 24 is provided) of semiconductor substrate 2 to LTHC film 23 through WSS 24, thereby breaking away the bond-structure of LTHC film 23. Consequently, as illustrated in FIG. 20B, WSS 24 is separated off from semiconductor substrate 2. At this time, the entirety of cover film 25 remains on the first principal surface side of semiconductor substrate 2 along with adhesive agent 22.

The present exemplary embodiment also has the advantage that metal, such as copper bumps, does not stick to WSS 24 because cover film 25 covers WSS 24, and therefore, it is easy to reuse WSS 24 by cleaning.

Figure 20:
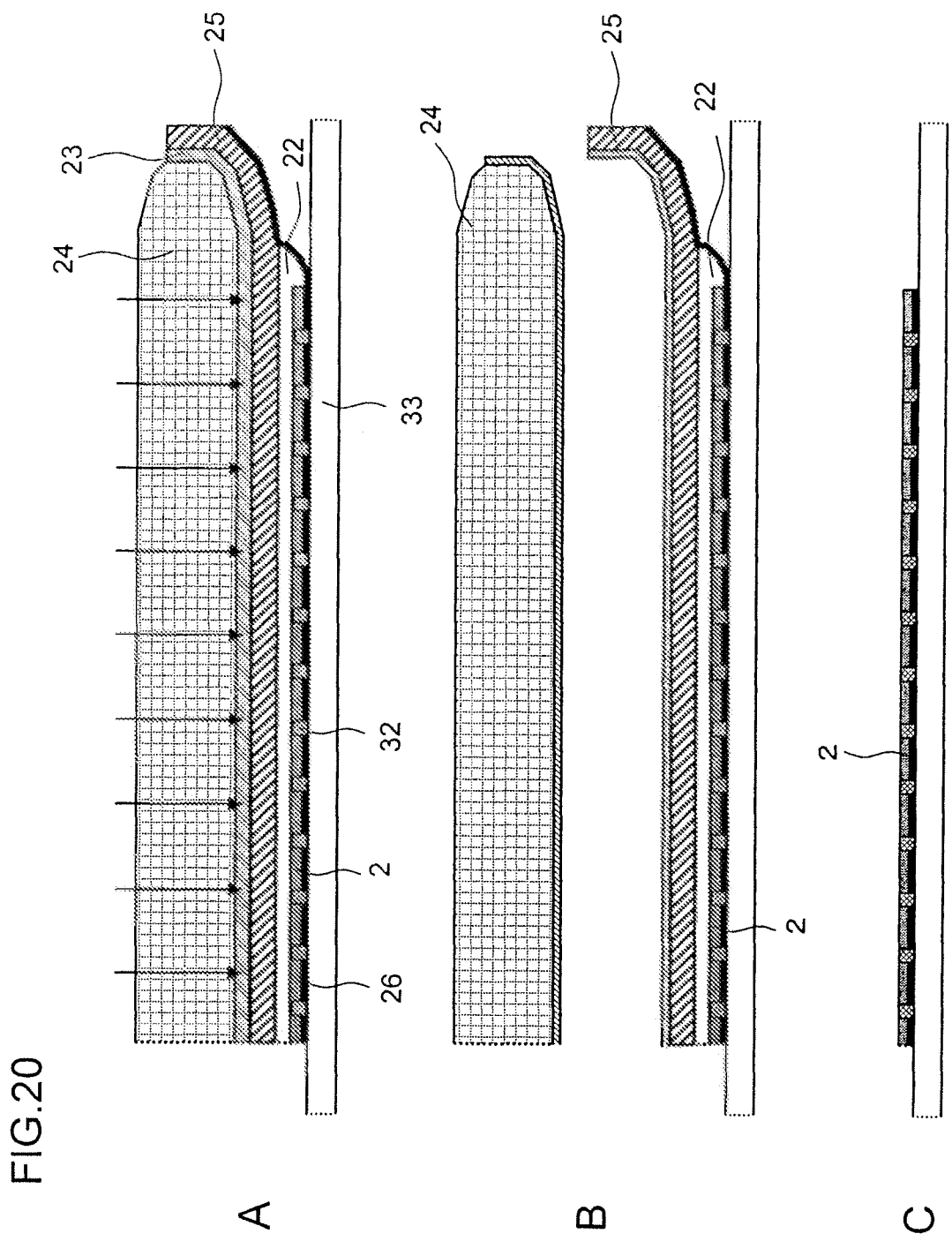

As illustrated in FIG. 20C, adhesive agent 22 adhered to semiconductor substrate 2 is removed. Thereafter, dicing is performed on semiconductor substrate 2, and then the step of FIG. 11 and subsequent steps in the first exemplary embodiment are carried out. In FIG. 20C, since cover film 25 is fixed onto adhesive agent 22 and can therefore be easily removed together with adhesive agent 22, cover film 25 does not remain on semiconductor substrate 2. In addition, the step of FIG. 20 can be set to the same conditions as those of the step of FIG. 10 in the first exemplary embodiment. However, the conditions may be varied as appropriate, according to the state of formation of cover film 25.

In the present exemplary embodiment, LTHC film 23 is covered with cover film 25 in the step of FIG. 19. Consequently, it is possible to reduce the possibility of any LTHC film 23-derived contaminants being introduced into portions of semiconductor substrate 2 under protective film 26, as in the first to third exemplary embodiments.

In addition, though in the first exemplary embodiment, portions of LTHC film 23 outside semiconductor substrate 2 are removed by a CMP method, these portions can also be removed by a CMP method by using conditions in which the portions are removed together with cover film 25 on LTHC film 23. Moreover, since cover film 25 is adhered to semiconductor substrate 2 through adhesive agent 22, it is possible to easily remove cover film 25 together with adhesive agent 22, without varying separation conditions.

It is apparent that the present invention is not limited to the above embodiments, but may be modified and changed without departing from the scope and spirit of the invention.

What is claimed is:

1. A method of manufacturing a semiconductor device, comprising:
    bonding a first principal surface of a substrate to a supporting substrate through a light-to-heat conversion film wherein there is a portion of the light-to-heat conversion film which extends beyond the bonded substrate on the supporting substrate; and then
    selectively removing only the portion of the light-to-heat conversion film exposed on the supporting substrate.

2. The method according to claim 1, further comprising:
grinding a second principal surface facing the first principal surface of the substrate in a thickness direction thereof, after bonding the substrate to the supporting substrate; and
cleaning the substrate, after the grinding the second principal surface of the substrate;
wherein the grinding the second principal surface of the substrate comprises finally polishing the second principal surface of the substrate by a chemical-mechanical polishing method, and
wherein the selectively removing the portion of the light-to-heat conversion film exposed on the supporting substrate is performed before or in the cleaning the substrate.

3. The method according to claim 1, further comprising:
polishing a second principal surface facing the first principal surface of the substrate in a thickness direction thereof by a chemical-mechanical polishing method,
wherein the selectively removing the portion of the light-to-heat conversion film exposed on the supporting substrate comprises polishing the, substrate by the chemical-mechanical polishing method.

4. The method according to claim 3,
wherein in the polishing the substrate by the chemical-mechanical polishing method, a mixture solution of a first aqueous solution containing silicon dioxide and an organic compound and a second aqueous solution containing inorganic salt is used as a slurry, the first aqueous solution having a pH value of 8 or larger but not larger than 12, the second aqueous solution having a pH value of 10 or larger but not larger than 14, and
the substrate is polished by the chemical-mechanical polishing method using a polishing pad having a compressive elasticity modulus of 70% or higher but not higher than 90%.

5. The method according to claim 2, further comprising selectively irradiating a laser to the portion of the light-to-heat conversion film exposed on the supporting substrate, after the bonding the substrate to the supporting substrate and before the cleaning the substrate,
wherein the selectively removing the portion of the light-to-heat conversion film exposed on the supporting substrate comprises:
selectively irradiating the laser to the portion of the light-to-heat conversion film exposed on the supporting substrate; and
performing at least one step of the grinding the second principal surface of the substrate and the cleaning the substrate.

6. The method according to claim 5,
wherein in the selectively irradiating the laser to the portion of the light-to-heat conversion film exposed on the supporting substrate, the laser is irradiated from a side of the second principal surface of the substrate toward a surface of the supporting substrate by using the substrate as a mask.

7. The method according to claim 6,
wherein the selectively irradiating the laser to the portion of the light-to-heat conversion film exposed on the supporting substrate is performed before the grinding the second principal surface of the substrate.

8. The method according to claim 5,
wherein in the selectively irradiating the laser to the portion of the light-to-heat conversion film exposed on the supporting substrate, the laser is irradiated toward a surface of the supporting substrate by using a protective member arranged in a position between the substrate and a light source of the laser and corresponding to a position of the substrate as a mask.

9. The method according to claim 8,
wherein the supporting substrate includes glass transmissive to the laser, and
in the selectively irradiating the laser to the portion of the light-to-heat conversion film exposed on the supporting substrate, the laser is irradiated from a surface on an opposite side of a surface of the supporting substrate to which the substrate is bonded, toward the surface of the supporting substrate.

10. The method according to claim 5,
wherein the grinding the second principal surface of the substrate comprises finally polishing the second principal surface of the substrate by a chemical-mechanical polishing method,
in the polishing the substrate by the chemical-mechanical polishing method, a mixture solution of a first aqueous solution containing silicon dioxide and an organic compound and a second aqueous solution containing inorganic salt is used as a slurry, the first aqueous solution having a pH value of 8 or larger but not larger than 12, the second aqueous solution having a pH value of 10 or larger but not larger than 14, and
the substrate is polished by the chemical-mechanical polishing method using a polishing pad having a compressive elasticity modulus of 70% or higher but not higher than 90%.

11. The method according to claim 2,
wherein the selectively removing the portion of the light-to-heat conversion film exposed on the supporting substrate is selectively coating a first chemical on the portion of the light-to-heat conversion film exposed on the supporting substrate, to selectively remove the portion of the light-to-heat conversion film.

12. The method according to claim 2, further comprising selectively coating a first chemical on the portion of the light-to-heat conversion film exposed on the supporting substrate, after the bonding the substrate to the supporting substrate and before the cleaning the substrate,
wherein the selectively removing the portion of the light-to-heat conversion film exposed on the supporting substrate comprises:
selectively coating the first chemical on the portion of the light-to-heat conversion film exposed on the supporting substrate; and
performing at least one step of the grinding the second principal surface of the substrate and the cleaning the substrate.

13. The method according to claim 11,
wherein the first chemical is a chemical including ammonia and a hydrogen peroxide aqueous solution.

14. The method according to claim 2,
wherein the method further comprises, before the bonding the substrate to the supporting substrate:
forming an interlayer insulating film on the first principal surface of the substrate;
forming part of a through silicon via plug, so as to penetrate through part of the interlayer insulating film; and
grinding an outer circumferential portion of the substrate, so that a diameter of the substrate becomes smaller than a diameter of the supporting substrate, and
wherein the method further comprises forming a remaining part of the through silicon via plug, so as to penetrate through a protective film, the substrate, and a remaining part of the interlayer insulating film and so as to connect to the part of the through silicon via plug from a side of the second principal surface of the substrate, after the forming the protective film on the second principal surface of the substrate.

15. The method according to claim 14, further comprising forming an insulating ring extending from a side of the first principal surface of the substrate in the thickness direction thereof and surrounding a predetermined region of the substrate positioned below the part of the through silicon via plug, before the forming the interlayer insulating film,
   wherein in the forming the remaining part of the through silicon via plug, the remaining part of the through silicon via plug is formed so as to penetrate through the protective film, the predetermined region of the substrate, and the remaining part of the interlayer insulating film.

16. The method according to claim 14,
   wherein in the forming the remaining part of the through silicon via plug, an insulating film is further formed so as to cover the protective film, the substrate, and a sidewall of the remaining part of the through silicon via plug buried in the remaining part of the interlayer insulating film.

\* \* \* \* \*